United States Patent [19]

Tokoh et al.

[11] Patent Number: 5,385,808

[45] Date of Patent: Jan. 31, 1995

[54] PHOTOSENSITIVE RESIN COMPOSITION AND SEMICONDUCTOR APPARATUS USING IT

[75] Inventors: Akira Tokoh, Tokyo; Nobuyuki Sashida, Nobuyuki; Etsu Takeuchi; Takashi Hirano, both of Yokohama, all of Japan

[73] Assignee: Sumitomo Bakelite Company Limited, Tokyo, Japan

[21] Appl. No.: 140,893

[22] Filed: Oct. 25, 1993

Related U.S. Application Data

[63] Continuation of Ser. No. 618,798, Nov. 28, 1990, abandoned.

[30] Foreign Application Priority Data

| Nov. 30, 1989 | [JP] | Japan | 1-309311 |
| Nov. 30, 1989 | [JP] | Japan | 1-309312 |
| Nov. 30, 1989 | [JP] | Japan | 1-309313 |
| Nov. 30, 1989 | [JP] | Japan | 1-309314 |
| Jan. 12, 1990 | [JP] | Japan | 2-003377 |
| Jan. 23, 1990 | [JP] | Japan | 2-011944 |
| Sep. 21, 1990 | [JP] | Japan | 2-250135 |

[51] Int. Cl.⁶ .................................... G03C 1/73
[52] U.S. Cl. ............................. 430/283; 430/281
[58] Field of Search .............................. 430/283, 281

[56] References Cited

U.S. PATENT DOCUMENTS

| 4,515,887 | 5/1985 | Davis | 430/283 |
| 5,025,088 | 6/1991 | Maeda et al. | 430/283 X |

FOREIGN PATENT DOCUMENTS

| 0337698 | 6/1990 | European Pat. Off. |  |
| 55-9538 | 1/1980 | Japan | 430/283 |
| 62-288826 | 12/1987 | Japan | 430/283 |
| 3-186848 | 8/1991 | Japan | 430/283 |
| 3-186849 | 8/1991 | Japan | 430/283 |

OTHER PUBLICATIONS

Patent Abstract of Japan, vol. 12, No. 28, (C-471) 2875, 27 Jan. 1988, & JP-A-62, Hitachi Chem. Co., 06 Aug. 1987.

Patent Abstract of Japan, vol. 13, No. 345, (P-909) 3693, 03 Aug. 1989, & JP-A-01 105241, Hitachi Chem. Co., 21 Mar. 1989.

*Primary Examiner*—Marion E. McCamish
*Assistant Examiner*—Laura Weiner
*Attorney, Agent, or Firm*—Browdy and Neimark

[57] ABSTRACT

The present invention provides a photosensitive resin composition which comprises as essential components:

(A) a polyamic acid having a recurring unit represented by the following formula [I]:

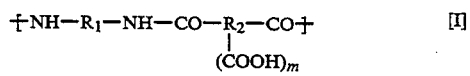

wherein 0.5–50 mol % of $R_1$ consists of a silicone diamine residue represented by the following formula [II]:

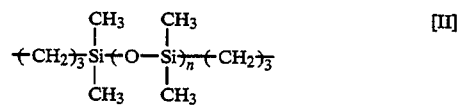

wherein n represents an integer of 1–50, and the remainder of 50–99.5 mol % of $R_1$ consists of an organic group selected from the group consisting of an aromatic group, an aliphatic group, an alicyclic group, and a heterocyclic group, and $R_2$ consists of an organic group selected from the group consisting of an aromatic group, an aliphatic group, an alicyclic group, a heterocyclic group, and a silicone group, and m represents 1 or 2, (B) an amide compound having carbon-carbon double bond, and (C) a photosensitizer.

The present invention further provides a semiconductor apparatus in which the above composition is used.

53 Claims, No Drawings

PHOTOSENSITIVE RESIN COMPOSITION AND SEMICONDUCTOR APPARATUS USING IT

This application is a continuation of co-pending application Ser. No. 07/618,798 filed Nov. 28, 1990, now abandoned.

The present invention relates to a photosensitive resin composition of high sensitivity and high resolution which can provide a polyimide film useful for a semiconductor apparatus, and furthermore relates to a semiconductor apparatus made by using the composition.

Hitherto, polyimide resins having superior heat resistance and excellent electrical properties and mechanical properties have been used for surface protective film and interlayer dielectrics of a semiconductor device. Recently, much improvement of thermal cycle resistance and thermal shock resistance has been demanded for high integration and enlargement of semiconductor devices, thinning and miniaturization of sealing resin packages and shifting to surface mounting method by solder reflowing, and conventional polyimide resins can hardly satisfy these demands.

For this purpose, it has been proposed to introduce a silicone component into a polyimide resin to enhance adhesion and decrease elasticity modulus. (Japanese Patent Laid-Open Nos. 61-64730 and 62-223228).

On the other hand, recently attention has been paid to technique of imparting photosensitivity to polyimide resins per se.

Use of such polyimide resins provided with photosensitivity not only results in an effect to simplify the step of pattern formation as compared with when polyimide resins having no photosensitivity are used, but also is preferred in safety and for prevention of environmental pollution because etching solution of high toxicity is not necessary. Thus, it is expected that photosensitization of polyimide resins becomes an important technique together with enhancement of adhesion and reduction of elasticity modulus of polyimide resins.

As photosensitive polyimide resins, there have been known a composition containing a polyimide precursor to which photosensitivity is imparted with an ester group and which has the structure represented by the following formula (X) (e.g., Japanese Patent Post-Exam. Publn. No. 55-41422):

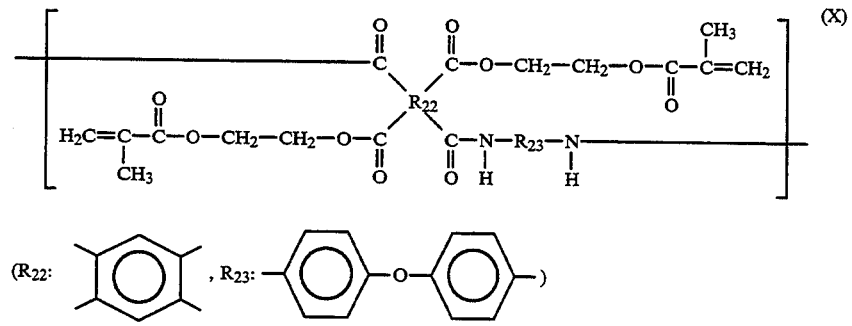

and a composition which comprises a polyamic acid having the structure represented by the following formula (Y) to which is added a compound containing carbon-carbon double bond and amino group or its quaternary salt which are dimerizable or polymerizable by actinic ray (e.g., Japanese Patent Post-Exam. Publn. No. 59-52822):

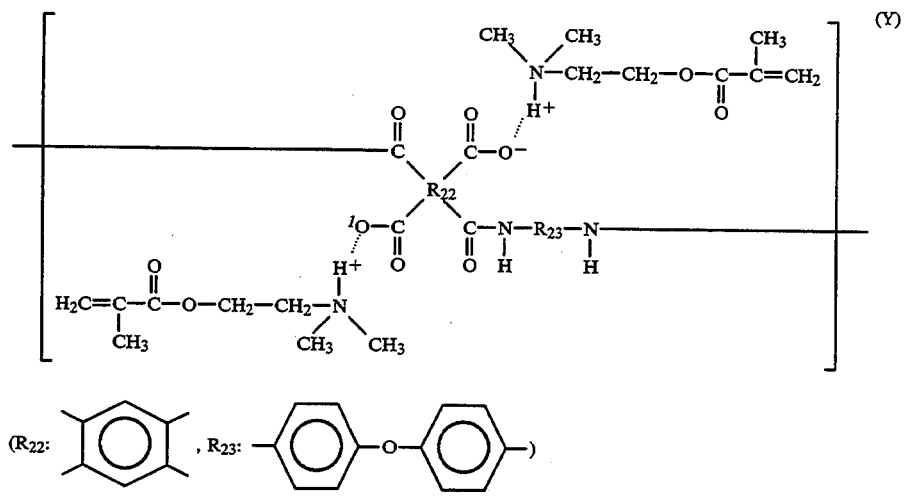

These compositions are dissolved in a suitable organic solvent, coated in the state of varnish and dried, and thereafter the coated film is irradiated with ultraviolet ray through a photomask, then subjected to development and rinsing treatments to obtain a desired pattern, which is further subjected to heat treatment to form a polyimide film.

However, these conventional compositions have the following defects. That is, the composition containing the polyimide precursor shown by (X) is produced through very complicated steps of first subjecting a tetracarboxylic acid dianhydride and an alcohol having a photosensitive group to esterification reaction and then subjecting the esterification product to amidation reaction with a diamine, and so stabilization of the products is difficult. However, since ester bond has strong bonding power, the composition has the advantage that spray development (rapid and short-time development by vigorous spraying of developing solution) can be employed. On the other hand, since the bonding power is too strong, the photosensitive group cannot be completely eliminated even at a high temperature of higher than 400° C. to cause blackening of the resulting polyimide film and deterioration in the film properties (strength, elongation, etc.). The composition containing the polyamic acid shown by (Y) can be produced only by mixing a polyamic acid with a photosensitive agent and so production steps are very simple, but ionic bonding power between the polyamic acid and the photosensitive agent is very weak, and so paddle development (development by dropping developing solution on stationary film to be developed) must be employed and besides, processing latitude at development is narrow. Moreover, change in viscosity of the varnish at room temperature is great and it lacks storage stability and thus it is insufficient for application to production of a semiconductor. On the other hand, the composition has the advantage that owing to the weak bonding power, the photosensitive agent can be easily eliminated by heating and properties of the resultant polyimide film are superior. However, both of the compositions containing (X) and (Y) have an exposure sensitivity of 500–1000 mJ/cm$^2$, which is not sufficient to attain the demand for enhancement of sensitivity with recent technical progress.

When such conventional photosensitization technique is applied to a polyimide resin into which a silicone group is introduced and which has high adhesion and low elasticity modulus, patterning by irradiation of ultraviolet ray is difficult or the polyimide resin is difficult to be processed by an exposing apparatus usually employed in semiconductor industry because of its extremely low sensitivity.

The objects of the present invention are:
(1) to provide a photosensitive resin composition of markedly high sensitivity and resolution,
(2) to provide a photosensitive resin composition with no variability in quality by very simple method, and
(3) to provide a photosensitive resin composition which is superior in film properties after cured and from which polyimide film of high reliability can be easily obtained when applied to a semiconductor apparatus and furthermore provide a semiconductor apparatus made by using the composition.

The present invention is a photosensitive resin composition which comprises, as essential components;
(A) a polyamic acid having a recurring unit represented by the following formula [I]:

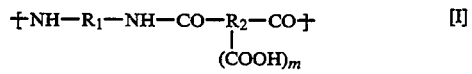

wherein 0.5–50 mol % of $R_1$ consists of a silicone diamine residue represented by the following formula [II]:

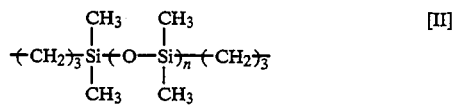

(wherein n represents an integer of 1–50) and the remainder of 50–99.5 mol % of $R_1$ consists of an organic group selected from the group consisting of an aromatic group, an aliphatic group, an alicyclic group, and a heterocyclic group, and $R_2$ consists of an organic group selected from the group consisting of an aromatic group, an aliphatic group, an alicyclic group, a heterocyclic group and a silicone group and m is 1 or 2,
(B) an amide compound having carbon-carbon double bond, and
(C) a photosensitizer.

Proportions of polyamic acid (A), amide compound (B) and photosensitizer (C) are 10–500 parts by weight, preferably 50–200 parts by weight of amide compound (B) and 0.1–50 parts by weight, preferably 1–10 parts by weight of photosensitizer (C) per 100 parts by weight of polyamic acid (A).

When amide compound (B) which is liquid at room temperature, is used both as a photosensitive agent and as a solvent as mentioned hereinafter, the amount of amide compound (B) means an amount of the compound (B) present substantially as a photosensitive agent after the compound (B) in an amount corresponding to that of the solvent has been evaporated.

The silicone diamines corresponding to the formula [II] used in the present invention have the effect to increase adhesion or increase adhesion and reduce elasticity modulus of the resulting polyimide film.

Polymerization degree n of the silicone diamines must be 1–50. If it is less than 1, the effect to enhance adhesion and reduce elasticity modulus cannot be obtained, and if it is more than 50, that is, when a long chain silicone diamine is used, reaction with a tetracarboxylic acid dianhydride hardly proceeds quantitatively and the diamine remains as an unreacted material and as a result, not only the molecular weight does not increase, but also flexibility decreases and cracks are apt to occur.

Amount of the silicone diamines must be 0.5–50% by mol based on total amount of diamines. If it is less than 0.5% by mol, effects to improve adhesion and reduce elasticity modulus cannot be obtained, and if it is more than 50% by mol, heat resistance extremely decreases and inherent characteristics as a polyimide resin cannot be obtained.

As diamine components corresponding to $H_2N$-$R_1$-$NH_2$, the following aromatic diamines, alicyclic diamines, aliphatic diamines or heterocyclic diamines can be used in addition to the above silicone diamines for imparting various properties: for example, m-phenylenediamine, 1-isopropyl-2,4-phenylenediamine, p-phenylenediamine, 4,4'-diaminodiphenylpropane, 3,3'-diaminodiphenylpropane, 4,4,-diaminodiphenylethane, 3,3'-diaminodiphenylethane, 4,4'-diaminodiphenylmethane, 3,3'-diaminodiphenymethane, 4,4'-diaminodiphenyl sulfide, 3,3'-diaminodiphenyl sulfide, 4,4'-diaminodiphenyl sulfone, 3,3'-diaminodiphenyl sulfone, 4,4'-diaminodiphenyl ether, 3,3'-diaminodiphenyl ether, benzidine, 3,3'-diaminobiphenyl, 3,3'-dimethyl-4,4'-diaminobiphenyl, 3,3'-dimethoxybenzidine, 4,4''-diamino-p-terphenyl, 3,3''-diamino-p-terphenyl, bis(p-aminocyclohexyl)methane, bis(p-β-amino-t-butylphenyl) ether, bis(p-β-methyl-δ-aminopentyl)benzene, p-bis(2-methyl-4-aminopentyl)benzene, p-bis(1,1-dimethyl-5-aminopentyl)benzene, 1,5-diaminonaphthalene, 2,6-diaminonaphthalene, 2,4-bis(β-amino-t-butyl)toluene, 2,4-diaminotoluene, m-xylene-2,5-diamine, p-xylene-2,5-diamine, m-xylylenediamine, p-xylylenediamine, 2,6-diaminopyridine, 2,5-diaminopyridine, 2,5-diamino-1,3,4-oxadiazole, 1,4-diaminocyclohexane, piperazine, methylenediamine, ethylenediamine, propylenediamine, 2,2-dimethylpropylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 5-methylnonamethylenediamine, 2,5-dimethylnonamethylenediamine, decamethylenediamine, 1,10-diamino-1,10-dimethyldecane, 2,11-diaminododecane, 1,12-diaminooctadecane, 2,12-diaminooctadecane, 2,17-diaminoeicosane, 2,6-diamino-4-carboxylic benzene, and 3,3'-diamino-4,4'-dicarboxylic benzidine. The present invention is not limited to use of them.

Aromatic or alicyclic or heterocyclic tetracarboxylic acid dianhydrides corresponding to

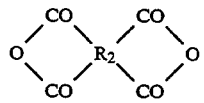

which are used preferably for preparation of a polyamic acid may be used alone or in admixture of two or more. Examples of the aromatic or alicyclic or heterocyclic tetracarboxylic acid dianhydrides are as follows: pyromellitic acid dianhydride, benzene-1,2,3,4-tetrabcarboxylic acid dianhydride, 3,3',4,4'-benzophenonetetracarboxylic acid dianhydride, 2,2'-3,3'-benzophenonetetracarboxylic acid dianhydride, 2,3,3', 4'-benzophenonetetracarboxylic acid dianhydride, naphthalene-2,3,6,7-tetracarboxylic acid dianhydride, naphthalene-1,2,5,6-tetracarboxylic acid dianhydride, naphthalene-1,2,4,5-tetracarboxylic acid dianhydride, naphthalene-1,4,5,8-tetracarboxylic acid dianhydride, naphthalene-1,2,6,7-tetracarboxylic acid 4,8-dimethyl-1,2,3,5,6,7-hexahydrodianhydride, naphthalene-1,2,5,6-tetracarboxylic acid dianhydride, 4,8-dimethyl-1,2,3,5,6,7-hexahydronaphthalene-2,3,6,7-tetracarboxylic acid dianhydride, 2,6-dichloronaphthalene-1,4,5,8-tetracarboxylic acid dianhydride, 2,7-dichloronaphthalene-1,4,5,8-tetracarboxylic acid dianhydride, 2,3,6,7-tetrachloronaphthalene-1,4,5,8-tetracarboxylic acid dianhydride, 1,4,5,8-tetrachloronaphthalene-2,3,6,7-tetracarboxylic acid dianhydride, 3,3',4,4'-diphenyltetracarboxylic acid dianhydride, 2,2',3,3'-diphenyltetraxcarboxylic acid dianhydride, 2,3,3',4'-diphenyltetraxcarboxylic acid dianhydride, 3,3'',4 4''-p-terphenyltetracarboxylic acid dianhydride, 2,2'',3 3''-p-terphenyltetracarboxylic acid dianhydride, 2,3,3'',4''-p-terphenyltetracarboxylic acid dianhydride, 2,2-bis(2,3-dicarboxyphenyl)propane dianhydride, 2,2-bis(3,4-dicarboxyphenyl)propane dianhydride, bis(2,3-dicarboxyphenyl) ether dianhydride, bis(3,4-dicarboxyphenyl) ether dianhydride, bis(2,3dicarboxyphenyl)methane dianhydride, bis(3,4-dicarboxyphenyl)methane dianhydride, bis(2,3-dicarboxyphenyl) sulfone dianhydride, bis(3,4dicarboxyphenyl) sulfone dianhydride, 1,1-bis(2,3-dicarboxyphenyl)ethane dianhydride, 1,1-bis(3,4-dicarboxyphenyl)ethane dianhydride, perylene-2,3,8,9-tetracarboxylic acid dianhydride, perylene-3,4,9,10-tetracarboxylic acid dianhydride, perylene-4,5,10,11-tetracarboxylic acid dianhydride, perylene-5,6,11,12-tetrabcarboxylic acid dianhydride, phenanthrene-1,2,7,8-tetracarboxylic acid dianhydride, phenanthrene-1,2,6,7-tetracarboxylic acid dianhydride, phenanthrene-1,2,9,10-tetrabcarboxylic acid dianhydride, cyclopentane-1,2,3,4-tetracarboxylic acid dianhydride, pyrazine-2,3,5,6-tetracarboxylic acid dianhydride, pyrrolidine-2,3,4,5-tetracarboxylic acid dianhydride, and thiophene-2,3,4,5-tetracarboxylic acid dianhydride. The present invention is not limited to use of them.

It is a matter of course that in addition to the above aromatic or alicyclic or heterocyclic tetracarboxylic acid dianhydrides, silicone tetracarboxylic acid dianhydrides or aliphatic tetracarboxylic acid dianhydrides can be used in combination with the above dianhydrides for imparting various characteristics.

There may be used trimellitic acid anhydride and the like as an aromatic tricarboxylic acid anhydride corresponding to

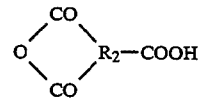

which can be used for preparation of a polyamic acid.

The polyamic acid used in the present invention can be obtained usually by reacting a tetracarboxylic acid dianhydride with a diamine in a reaction solvent as shown below. The reaction solvent is a known organic polar solvent having a dipole moment and having a functional group which does not react with acid anhydrides and diamines.

The organic polar solvent must be inert to the reaction system and be a solvent for the product and besides, it must be a solvent for at least one, preferably both of reaction components.

Typical examples of the solvent are N,N-dimethylformamide, N,N-dimethylacetamide, N,N-diethylformamidfe, N,N-diethylacetamide, N,N-dimethylmethoxyacetamide, dimethyl sulfoxide, hexamethylphosphamide, N-methyl-2-pyrrolidone, pyridine, dimethylsulfone, tetramethylene sulfone, dimethyltetramethylene sulfone, methylformamide, N-acetyl-2-pyrrolidone, diethylene glycol monomethyl ether, and diethylene glycol dimethyl ether. These solvents may be used alone or in combination of two or more. Poor solvents such as benzene, benzonitrile, dioxane, butyrolactone, methyl cellosolve, ethyl cellosolve, butyl cellosolve, xylene, toluene, and cyclohexane may be used in combination with the above solvents.

Polymerization degree of polyamic acid (A) in the present invention is preferably 10–10000, more preferably 20–500. If the polymerization degree is lower than 10, mechanical strength and heat resistance of the resulting cured film deteriorate. If the polymerization degree is higher than 10000, viscosity of the resin increases and not only coating operation is difficult, but also long time is required for development and productivity decreases.

When polyamic acid (A) having actinic ray responsive groups P* introduced at both ends is used, exposure sensitivity can be increased and this is useful. P* having acrylic or methacrylic group used in the acid anhydride terminated type polyamic acid (A) which is represented by the following formula [III]:

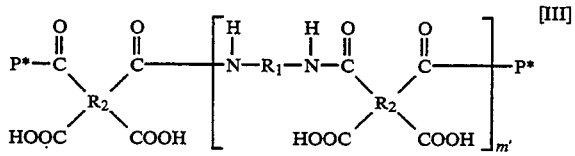

wherein m' is an integer of 10–10000, and $R_1$ and $R_2$ are the same as defined above in the formula [I], and P* is represented by the formula:

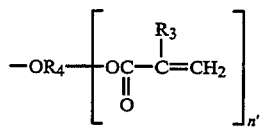

wherein n' is 1–5, $R_3$ represents H or $CH_3$, and $R_4$ represents an organic residue, is usually obtained from alcohols having acrylic or methacrylic group. Alcohol compounds having acrylic or methacrylic group include, for example, 2-hydroxyethyl methacrylate, 2-hydroxyethyl acrylate, glycerol diacrylate, glycerol dimethacrylate, glycerol acrylate methacrylate, 3-hydroxypropyl methacrylate, 3-hydroxypropyl acrylate, 4-hydroxybutyl acrylate, 4-hydroxybutyl methacrylate, 2-hydroxypropyl acrylate, 2-hydroxypropyl methacrylate, polyethylene glycol modified acrylate, polypropylene glycol modified acrylate, polyethylene glycol modified methacrylate, polypropylene glycol modified methacrylate, pentaerythritol triacrylate, pentaerythritol trimethacrylate, pentaerythritol acrylate dimethacrylate, pentaerythritol diacrylate methacrylate, dipentaerythritol pentaacrylate, dipentaerythritol pentamethacrylate, 1,3-diacryloylethyl-5-hydroxyethyl isocyanurate, 1,3-dimethacryloylethyl-5-hydroxyethyl isocyanurate, ethylene glycol modified pentaerythritol triacrylate, propylene glycol modified pentaerythritol triacrylate, trimethylolpropane diacrylate, and trimethylolpropane dimethacrylate. The present invention is not limited to use of these alcohol compounds. These may be used alone or in combination of two or more.

One example of processes for preparation of the acid anhydride terminated type polyamic acid represented by the formula [III]is as follows: when a polyamic acid of polymerization degree m' of 1000 is desired, first 1001 moles of an acid anhydride is reacted with n moles of a silicone diamine (usually 1<n<500 and the proper amount varies depending on molecular weight of the silicone diamine used) and 2 moles of an alcohol compound having P* having acrylic or methacrylic group and then, the reaction product is reacted with (1000-n) moles of a diamine, thereby to obtain the desired polyamic acid.

Since the polyamic acid [III]has P* having acrylic or methacrylic group at both ends., crosslinking density of exposed portion of the resulting coated film increases and on the other hand, unexposed portion has highly soluble and uncrosslinked responsive group P*, and thus difference between solubility of exposed portion and that of unexposed portion can be increased and thus sensitivity can be enhanced. Moreover, since both ends of the polyamic acid are protected with actinic ray responsive group P*, depolymerization of the polyamic acid does not occur, and so resin superior in viscosity stability can be obtained.

Examples of amide compound (B) having carbon-carbon double bond are as follows: acrylamide, methacrylamide, N-methylacrylamide, N-ethylacrylamide, N-methylmethacrylamide, N-ethylmethacrylamide, N,N-dimethylacrylamide, N,N-diethylacrylamide, N,N-dibutylacrylamide, N-acryloylpiperidine, N-acryloylmorpholine, N,N-dimethylmethacrylamide, N,N-diethylmethacrylamide, N,N-dimethylaminoethylmethacrylamide, N,N-dimethylaminopropylmethacrylamide, N-methylolacryamide, N-methylolmethacrylamide, N-methoxymethylacrylamide, N-methoxymethylmethacrylamide, N-ethoxymethylacrylamide, N-ethoxymethylmethacrylamide, N-isopropoxymethylacrylamide, N-isopropoxymethylmethacrylamide, N-n-butyloxymethylacrylamide, N-n-butyloxymethylmethacrylamide, N-t-butyloxymethylacrylamide, N-t-butyloxymethylmethacrylamide, N,N-dimethylolacrylamide, N,N-dimethylolmethacrylamide, dimethylene ether diacrylamide, dimethylene ether dimethacrylamide, methylenebisacrylamide, methylenebismethacrylamide, diacetoneacrylamide, diacetonemethacrylamide, N-vinylpyrrolidone, and ether type condensates of polyhydric alcohols with N-methylolacrylamide or N-methylolmethacrylamide. These amides may be used alone or in combination of two or more.

It was known, for example, in Japanese Patent Laid-Open No. 62-273260 to add the amide compound having carbon-carbon double bond of the present invention as an additive to a resin composition which has already photosensitivity. However, a photosensitive polyamic acid resin composition which contains an amide compound per se as a component for imparting photosensitivity, has not been known. Conventional techniques consist mainly of addition or introduction of acrylic acid or methacrylic acid esters to a polyamic acid, and the present inventors have newly paid attention to an amide compound having bcarbon-carbon double bond.

This amide compound having carbon-carbon double bond is superior in solubility in a polyamic acid, and so the photosensitive agent can be incorporated uniformly and at high concentration and besides, it is high in photo-reactivity. Therefore, a photosensitive resin composition capable of providing a pattern of high sensitivity and high resolution can be readily obtained. Furthermore, in the present invention a photosensitive group is not introduced into polyamic acid through direct covalent bond and therefore, there are obtained simultaneously both of the excellent effects that the amide compound having carbon-carbon double bond is easily scattered with heat at heat curing and the resulting cured film has good properties.

In the case of using acrylic acid esters as in conventional techniques, even the mixture type as disclosed in Japanese Patent Post-Exam. Publn. No. 59-52822 requires heating at 350° C. for 30 minutes and the reaction type as disclosed in Japanese Patent Post-Exam. Publn. Nos. 55-30207 and 41422 requires heating at 400° C. for 1 hour for curing. Therefore, final cured product considerably blackens and, in the worst case, crumbles and thus strong film cannot be obtained.

In the present invention, use of amide compounds having carbon-carbon double bond which are liquid at room temperature is more useful. Such amide compounds are liquid usually at 10°–30° C. and include, for example, N-methylacrylamide, N-ethylacrylamide, N-methylmethacrylamide, N-ethylmethacrylamide, N,N- dimethylacrylamide, N,N-diethylacrylamide, N,N-dibutylacrylamide, N-acryloylpiperidine, N-acryloylmorpholine, N,N-dimethylmethacrylamide, N,N-diethylmethacrylamide, N-(2-dimethylaminoethyl)methacrylamide, N-(3-dimethylaminopropyl)methacrylamide, and N-vinylpyrrolidone. The present invention is not limited to use of these amide compounds.

These amide compounds which are liquid at room temperature usually show good solubility for polyamic acids and diamines and tetracarboxylic acid dianhydrides which are starting materials for polyamic acids. Therefore, these amide compounds which are liquid at room temperature can be used for preparation of polyamic acids in place of usual solvents.

Conventional reaction solvents have no responsiveness to light, and so a photosensitive component is especially added in production of photosensitive resins. However, in this case, the photosensitive component is diluted with a large amount of reaction solvent and thus there is a limit for increasing concentration of the photosensitive component.

On the other hand, according to the present invention where the above-mentioned amide compounds are used as a solvent, the solvent per se is totally photosensitive and hence, concentration of the photosensitive component is very high and photosensitivity can be markedly enhanced. Furthermore, since process for production of the photosensitive resin composition according to the present invention comprises merely adding and mixing respective components, the process is very simple and variability of quality is very small.

N-methylol(or N-alkoxymethyl)acryl (or methacryl)amide used in the present invention is a compound which has in one molecule a highly heat-reactive N-methylol or N-alkoxymethyl group and a highly photo-reactive acrylamide or methacrylamide group. That is, in N-methylol (or N-alkoxymethyl)acryl (or methacryl)amide, N-methylol or N-alkoxymethyl group first brings about heat-condensation reaction in heat drying step for vaporization of a solvent at the time of formation of a photo-pattern and furthermore, acrylamide or methacrylamide group causes photo-crosslinking reaction in light irradiation step, whereby a photo-pattern of high sensitivity can be formed.

N-methylol (or N-alkoxymethyl)acryl (or methacryl)amide is usually obtained by reaction of acryl or methacrylamide with formalin and an alcohol.

The N-methylol(or N-alkoxymethyl)acryl (or methacryl)amide includes, among the amide compounds having carbon-carbon double bond mentioned hereinbefore, the following: N-methylolacrylamide, N-methylolmethacrylamide, N-methoxymethylacrylamide, N-methoxymethylmethacrylamide, N-ethoxymethylacrylamide, N-ethoxymethylmethacrylamide, N-isopropoxymethylacrylamide, N-isopropoxymethylmethacrylamide, N-n-butyloxymethylacrylamide, N-n-butyloxymethylmethacrylamide, N-t-butyloxymethylmethacrylamide, N-t-butyloxymethylmethacrylamide, N,N-dimethylolacrylamide, and N,N-dimethylolmethacrylamide. The present invention is not limited to use of these amide compounds.

Further, when the above N-methylol (or N-alkoxymethyl)acryl (or methacryl)amide is subjected to heat-reaction in a weak acid having such acidity as that of polyamic acids, dimerization with dehydration takes place and dimethylene ether diacrylamide or dimethylene ether dimethacrylamide is obtained. These also have good dissolvability for polyamic acids and use of them results in a photosensitive resin composition of high sensitivity.

In the present invention, it is also possible to use another type condensate of amide compounds with alcohols as an amide compound.

Ether type condensates of N-methylolacrylamide or N-methylolmethacrylamide with polyhydric alcohols are compounds which have two or more highly photo-reactive acrylamide or methacrylamide groups in one molecule. The ether type condensates of N-methylolacrylamide or N-methylolmethacrylamide with polyhydric alcohols not only are high in dissolvability for polyamic acids, but also make it possible to form a photo-pattern of high sensitivity and high resolution as a result of photo-crosslinking reaction of acrylamide or methacrylamide group in light irradiation step at formation of photo-patterns.

The ether type condensates of N-methylolacrylamide or N-methylolmethacrylamide with polyhydric alcohols can usually be obtained by reaction using an acid such as phosphoric acid as a catalyst.

The polyhydric alcohols include, for example, ethylene glycol, diethylene glycol, tetraethylene glycol, polyethylene glycol, 1,4-butanediol, 1,3-butanediol, glycerine, pentaerythritol, polyvinyl alcohol, triethanolamine, N-methyldiethanolamine, diethanolamine, and N-phenyldiethanolamine. The present invention is not limited to use of these polyhydric alcohols. Besides these acrylamides, acrylic acid esters may also be added for imparting various properties.

Among acrylic acid esters, dialkylamino acrylates or methacrylates are superior in dissolvability for polyamic acids and can increase sensitivity of the composition. Examples of dialkylamino acrylates or methacrylates are N,N-dimethylaminoethyl methacrylate, N,N-dimethylaminoethyl acrylate, N,N-diethylaminoethyl methacrylate, N,N-diethylaminoethyl acrylate, N,N-dimethylaminopropyl methacrylate and N,N-dimethylaminopropyl acrylate. The present invention is not limited to use of them.

Addition amount of an amino acrylate is 1–100 parts by weight, preferably 5–30 parts by weight per 100 parts by weight of a polyamic acid.

The photosensitizer (C) used in the present invention efficiently produces radicals or ions by irradiation with light and accelerates photo-reaction of an amide compound having carbon-carbon double bond.

The photosensitizers used in the present invention include, for example, benzophenone, acetophenone, anthrone, p,p'-tetramethyldiaminobenzophenone (Michler's ketone), phenanthrene, 2-nitrofluorene, 5-nitroacenaphthene, benzoquinone, N-acetyl-p-nitroaniline, p-nitroaniline, 2-ethylanthraquinone, 2-t-butylanthraquinone, N-acetyl-4-nitro-1-naphthylamine, picramide, 1,2-benzanthraquinone, 3-methyl-1,3-diaza-1,9-benzanthrone, p,p'-tetraethyldiaminobenzophenone, 2-chloro-4-nitroaniline, dibenzalacetone, 1,2-naphthoquinone, 2,5-bis(4'-diethylaminobenzal)cyclopentane, 2,6-(bis 4'-diethylaminobenzal)cyclohexanone, 2,6-(bis 4'-dimethylaminobenzal)-4-methylcyclohexanone, 2,6-(bis 4'-diethylaminobenzal)-4-methylcyclohexanone, 4,4'-bis(dimethylamino)-chalcone, 4,4'-bis(diethylamino)chalcone, p-dimethylaminobenzylideneindanone, 1,3-bis-(4'-dimethylaminobenzal)acetone, 1,3-bis(4'-diethylaminobenzal) acetone, N-phenyldiethanolamine, N-p-tolyldiethylamine, styryl compounds and coumarin compounds and furthermore, 2,2-dimethoxy-2-phenylacetophenone, 1-hydroxycyclohexylphenyl ketone, 2-methyl-[ 4-(methylthio)-phenyl]-2-morpholino-1-propane, 3,3',4,4'-tetra(t-butyl-peroxycarbonyl)benzophenone, benzyl, benzoin-isopropyl ether, benzoin-isobutyl ether, 4,4'-dimethoxybenzyl, 1,4-dibenzoylbenzene, 4-benzoylbiphenyl, 2-benzoyl-naphthalene, methyl-o-benzoyl benzoate, 2,2'-bis(o-chlorophenyl)-4,4',5,5'-tetraphenyl-1,2'-biimidazole, 10-butyl-2-chloroacridone, ethyl-4-dimethylamino benzoate, dibenzoylmethane, 2,4-diethylthioxanthone, 3,3-dimethyl-4-methoxybenzophenone, 2-hydroxy-2-methyl-1-phenylpropane-1-one, 1-(4-isopropylphenyl)-2-hydroxy-2-methylpropane-1-one, 1-(4-dodecylphenyl)-2-hydroxy-2-methylpropane-1-one, 1-phenyl-1,2-butanedione-2-(o-methoxycarbonyl)oxime, 1-phenyl-propanebutanedione-2-(o-benzoyl)oxime, 1,2-diphenylethanedione-1-(o-benzoyl)oxime, 1,3-diphenyl-propanetrione-2-(o-benzoyl)oxime, 1-phenyl-3-ethoxy-propanetrione-2-(o-benzoyl)oxime, glycine compounds, and oxazolone compounds. The present invention is not limited to use of these exemplified compounds. These may be used alone or in combination of two or more.

Furthermore, the sensitizer used in the present invention is preferably a compound having an absorption maximum wavelength (λ max) in 330–500 nm. If λ max is less than 330 nm, light is absorbed into polyamic acid per se and photo-reaction does not take place. On the other hand, if it is more than 500 nm, photo-reaction takes place with visible light and so working room must be a shielded room and thus, handleability is lowered. Examples of such sensitizers are shown below. The present invention is not limited thereto and these sensitizers may be used alone or in combination of two or more.

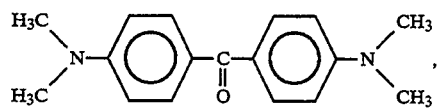

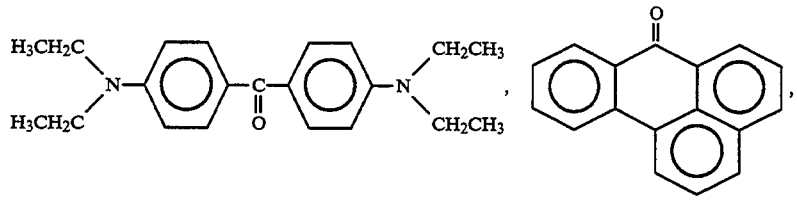

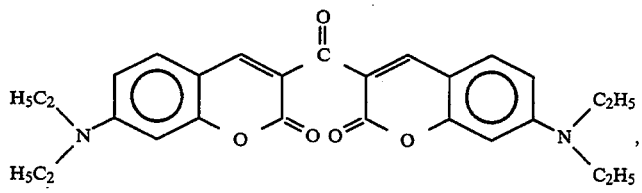

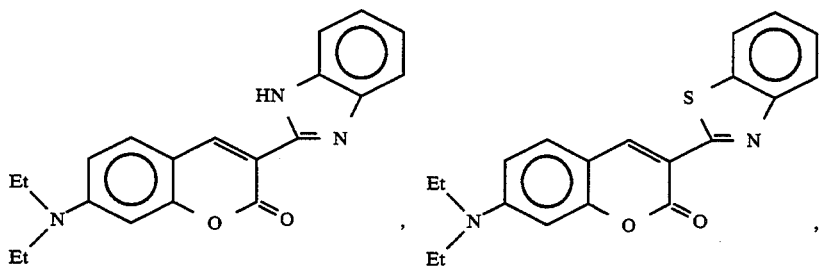

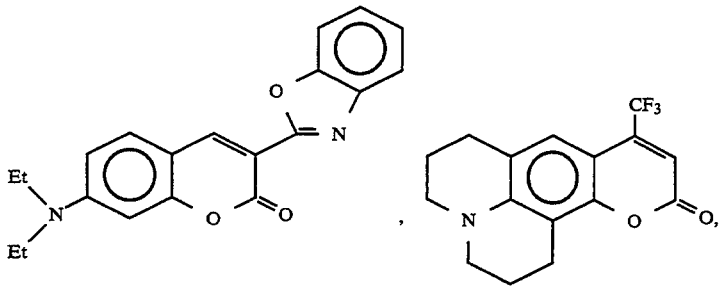

-continued
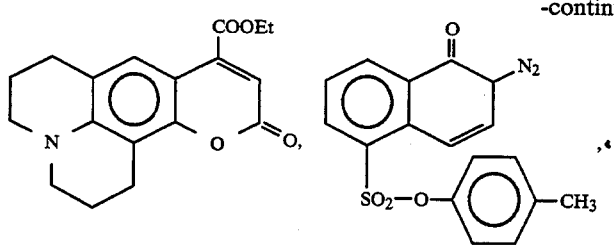
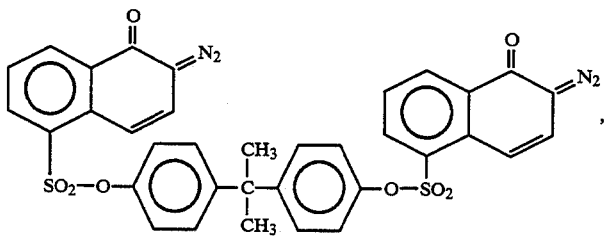
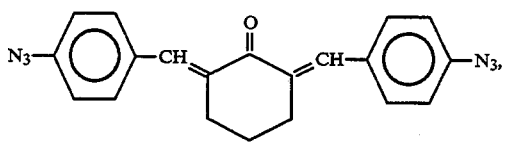
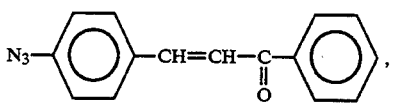
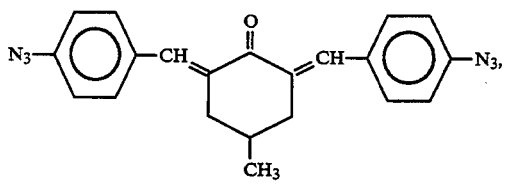
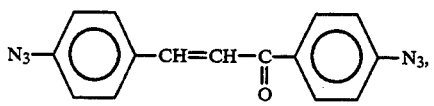
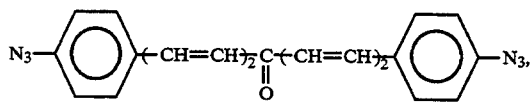
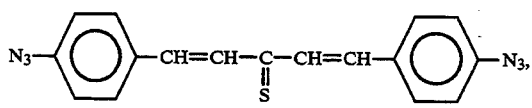
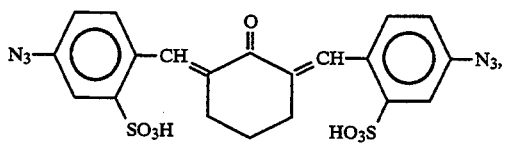
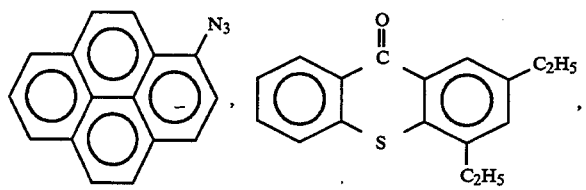

-continued
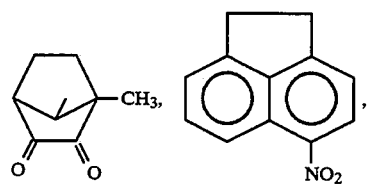
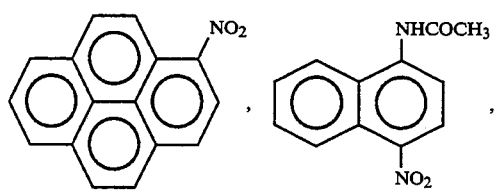
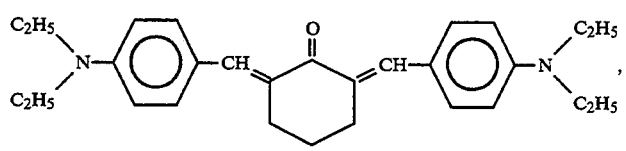
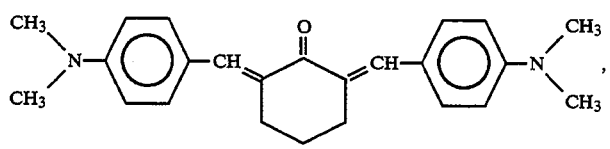
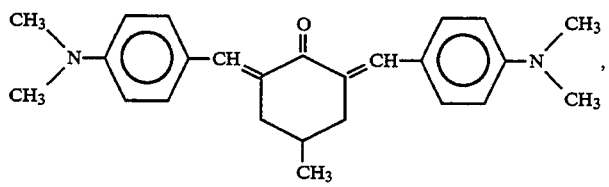
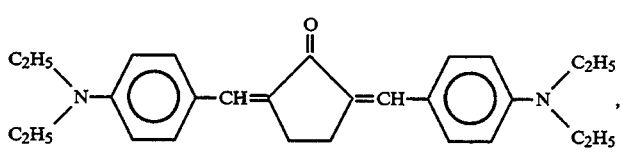
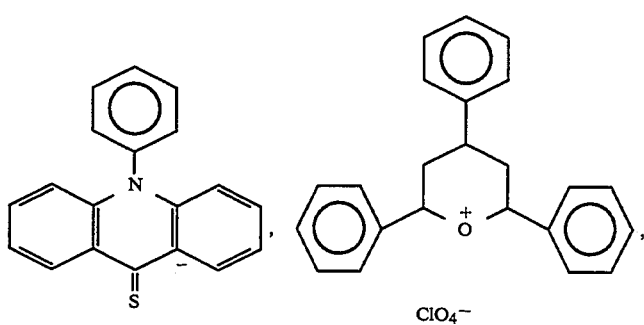

-continued
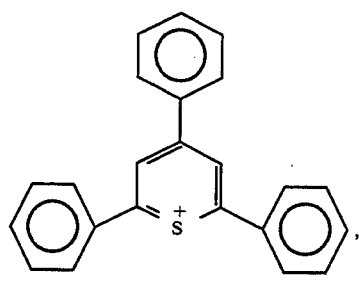
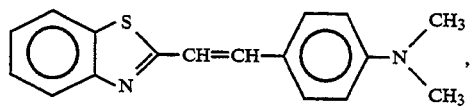
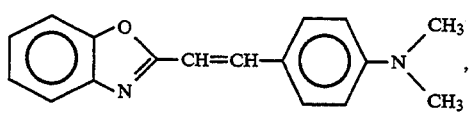
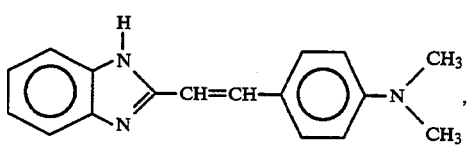
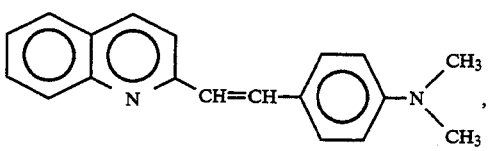
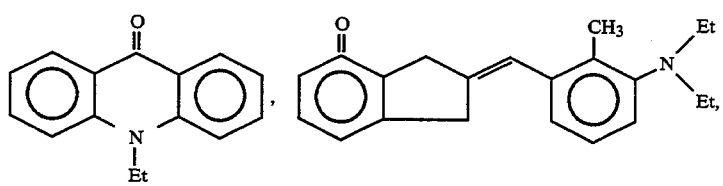
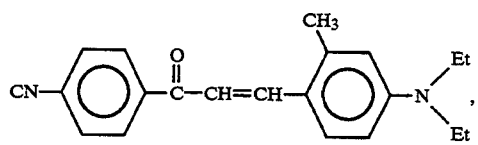
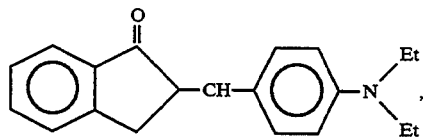
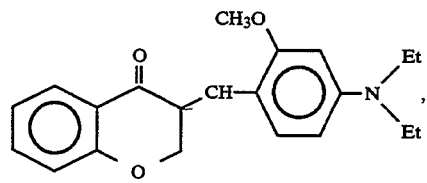

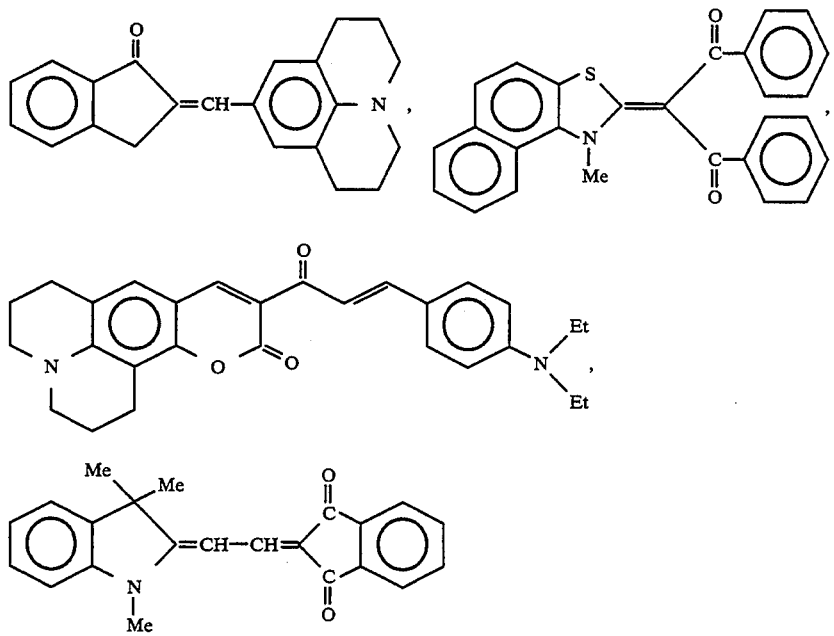

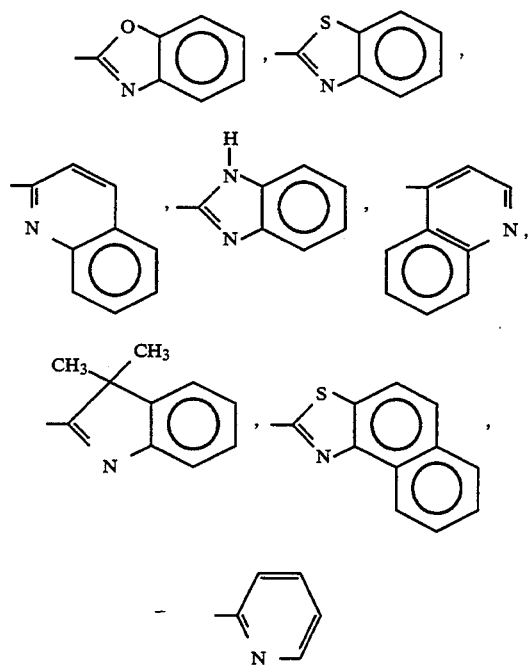

When a styryl compound represented by the following formula [XI] is used as a sensitizer component, sensitivity is enhanced and use of it is preferred.

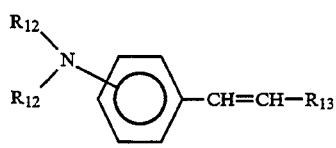

wherein $R_{12}$: —H, —CH$_3$, —C$_2$H$_5$, or —C$_6$H$_5$, $R_{13}$:

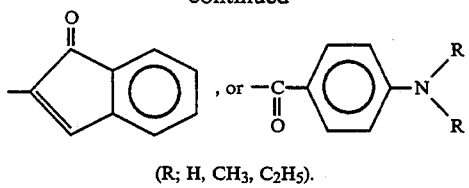

(R; H, CH$_3$, C$_2$H$_5$).

Furthermore, sensitivity is further enhanced when a glycine compound represented by the following formula [XII] is used as a sensitizer component. It is especially preferred to use this glycine compound in combination with the above-mentioned compound having an absorption maximum wavelength in 330–500 nm or the above-mentioned styryl compound.

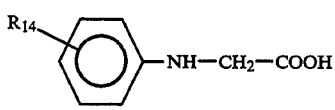

wherein $R_{14}$: —H, —CH$_3$, —C$_2$H$_5$, —C$_6$H$_5$, —OCH$_3$, —OCOCH$_3$, —OC$_2$H$_5$, —OCOC$_2$H$_5$, —N(CH$_3$)$_2$, —N(C$_2$H$_5$)$_2$, —NHCOOCH$_3$, —COCH$_3$, —COC$_2$H$_5$, —NHCONH$_2$, —CH$_2$OH, —OH, —CH(CH$_3$)$_2$, or —C(CH$_3$)$_3$.

Furthermore, it is preferred to use as a sensitizer component a biscoumarin compound substituted with carbonyl group at 3-position as shown by the following formula [XIII]:

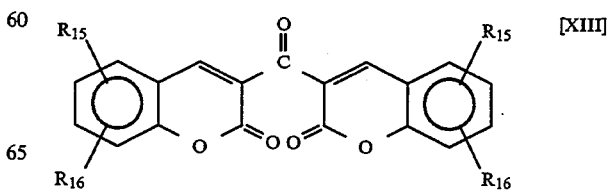

wherein $R_{15}$ and $R_{16}$ each represents hydrogen atom, an alkoxy group or a dialkylamino group.

It is especially preferred to use this biscoumarin compound in combination with the above-mentioned glycine compound.

It is also preferred to use as the photosensitizer (C) an oxazolone compound represented by the following formula [XIV]:

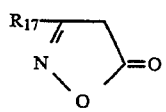

wherein $R_{17}$:

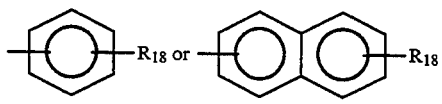

$R_{18}$: —H, —CH$_3$, —C$_2$H$_5$, —C$_3$H$_7$, —C$_4$H$_9$, —C$_6$H$_5$, —OH, —OCH$_3$, or —OC$_2$H$_5$.

It is especially preferred to use this oxazolone compound in combination with the above-mentioned compound having a maximum absorption wavelength in 330–500 nm, the above-mentioned styryl compound or the above-mentioned biscoumarin compound.

Adhesive aid, leveling agent and other various additives may be added to the photosensitive resin composition of the present invention.

The photosensitive resin composition of the present invention can be used, for example, in the following manner: that is, the composition is first coated on a suitable support such as silicon wafer, ceramic substrate or aluminum substrate. Coating is carried out by spin coating with a spinner, spray coating with a spray coater, dip coating, printing, roll coating or the like. Then, the coated film is pre-baked at a temperature of 60°–80° C. to dry it. Thereafter, the film is irradiated with actinic ray in the form of the desired pattern. As actinic rays, X-ray, electronic ray, ultraviolet ray, visible ray and the like may be used, but preferred are those which have a wavelength of 200–500 nm.

Then, unirradiated portion is dissolved away with a developing solution to obtain a relief pattern. As the developing solution, there may be used N-methyl-2-pyrrolidone, N,N-dimethylacetamide, N,N-dimethylformamide, methanol, isopropyl alcohol, water or the like alone or in admixture of them. Development can be carried out by spray, paddle, dip or ultrasonic development.

Then, the relief pattern formed by development is rinsed. As rinsing solution, there may be used methanol, ethanol, isopropyl alcohol, butyl acetate or the like. Then, the relief pattern is subjected to heat treatment to form an imide ring to obtain a final pattern high in heat resistance.

The photosensitive resin composition of the present invention can be mainly used for electronic materials, for example, semiconductor apparatuses as shown below in the form of composites with inorganic materials.

(i) Semiconductor apparatuses wherein the composition is coated on the surface of a semiconductor device such as IC or LSI, and is subjected to exposing, development, and curing to form a pattern, and this is used as a passivation film, a buffer film or an α-ray protective film.

(ii) Semiconductor apparatuses wherein the composition was coated on a semiconductor device such as IC or LSI, and is subjected to exposing, development and curing to form a pattern, and furthermore conductor circuit is wired and connected to the lower conductor layer and this is repeated and thus the resin is used as an insulation film between multi-layer wirings.

(iii) Semiconductor apparatuses wherein a pattern is formed on a substrate of silicon, alumina or the like to form an insulation layer and then, wiring of conductor circuit is carried out and this is repeated to connect with a semiconductor device.

The photosensitive resin composition of the present invention is useful not only for semiconductor, but also for layer insulation film of multilayer circuit, cover coat of flexible copper-clad sheet, solder resist film, liquid crystal oriented film, and the like.

It has been attempted to introduce siloxane bond into main chain structure of a polyimide resin for improvement of adhesion and reduction of elasticity modulus. However, according to the conventional photosensitization techniques, photosensitivity of a silicone-modified polyimide resin cannot be improved and good pattern cannot be formed. On the other hand, according to the present invention, a photosensitive resin composition can be obtained by a very easy operation of adding an amide compound (B) having carbon-carbon double bond and a photosensitizer (C) to a silicone-modified polyamic acid (A). Therefore, not only production cost is low, but also the photosensitive agent can be incorporated in the polyamic acid uniformly and at high concentration since the compound having carbon-carbon double bond is easily compatibilized with the polyamic acid by the amide group.

Furthermore, by adding a photosensitizer component, a photosensitive resin composition which can provide a pattern of high sensitivity and high resolution can be easily obtained. Moreover, this photosensitive resin composition is obtained by addition of a photosensitive agent, and a photosensitive group is not introduced into the polyamic acid through direct covalent bond, and therefore the photosensitive agent can be easily scatered with heat at curing, and performance of the silicone-modified polyimide is exhibited, and the excellent effects of high adhesion and low elasticity modulus can be simultaneously obtained. Therefore, semiconductor devices of high reliability can be obtained by easy processing with the present composition.

There occur no problems even when additives in addition to the essential components (A), (B) and (C) are added in order to impart various characteristics.

The present invention will be explained in more detail by the following examples.

EXAMPLE 1

10 g of a compound having five siloxane bonds (n=5) represented by the following formula as a silicone diamine (10% by weight in polyamic acid), 57 g of 3,3′,4,4′-benzophenonetetracarboxylic acid dianhydride and 33 g of 4,4′-diaminodiphenyl ether were reacted in N-methylpyrrolidone.

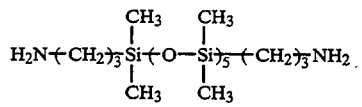 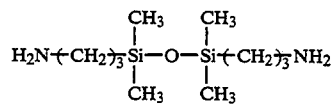

The resulting polyamic acid had a number-average molecular weight of 22,000 measured by GPC and thus, a polyamic acid of high molecular weight was obtained with no variation in quality.

To the resulting polyamic acid solution (100 parts by weight in terms of solid content) there were added 60 g (60 parts by weight) of methacrylamide and 10 g (10 parts by weight) of Michler's ketone and these were dissolved at room temperature.

The resulting solution was coated on an aluminum sheet by a spinner and dried at 80° C. for 1 hour by an oven to obtain a film.

On this film was superposed a photographic step tablet No. 2 (21 steps) manufactured by Kodak Co. (in this gray scale, with increase by one step in the number of steps, quantity of transmitted light decreases to $1/\sqrt{2}$ of that of the preceding step and hence sensitivity is higher with increase in the number of steps where pattern remains after development), and then the film was irradiated with ultraviolet ray of 1000 mj/cm$^2$ and subsequently developed with a developing solution comprising 60% by weight of N-methylpyrrolidone and 40% by weight of methanol and furthermore rinsed with isopropyl alcohol. Patterns of up to six steps remained and thus it was found that the film had high sensitivity.

Separately, in the same manner as above, a pattern was formed using a mask for measuring resolution manufactured by Toppan Printing Co., Ltd. (Toppan Test Chart No. 1). The pattern was resolved up to 4 μm and this indicates high resolution.

Separately, the solution obtained was coated on a silicon wafer and the whole surface was exposed and subjected to development and rinsing and then heat-cured at 150° C. 250° C. and 350° C. for 30 minutes in nitrogen, respectively.

For adhesion test, the cured film was cut crosswise to form 100 squares of 1 mm$^2$ and it was tried to peel off these squares using Cellotape (a cellophane adhesive tape), but no squares were peeled off. This indicates high adhesion.

Separately, the solution obtained was coated on an aluminum sheet and subjected to overall exposure, development, rinsing and heat curing and then, the aluminum sheet was removed by etching to obtain a film.

The film had a low tensile modulus of 210 kg/mm$^2$ as measured according to JIS K-6760.

Thus, excellent effects (when applied to a semiconductor device) of high sensitivity, high resolution, high adhesion, and low modulus were simultaneously obtained.

EXAMPLE 2

10 g of a compound having one siloxane bond (n=1) represented by the following formula as a silicone diamine (10% by weight in polyamic acid), 60 g of 3,3', 4,4'-benzophenonetetracarboxylic acid dianhydride and 30 g of 4,4'-diaminodiphenyl ether were reacted in N-methylpyrrolidone.

Thereafter, the same procedure as in Example 1 was carried out. The results were as follows: the number of steps in the step tablet was 8, resolution was 3 μm, and no squares were peeled off in the Cellotape peeling test. Thus, excellent effects of high sensitivity, high resolution, and high adhesion which are useful when applied to a semiconductor device, were simultaneously obtained.

EXAMPLE 3

A photosensitive resin was obtained in the same manner as in Example 1 except that pyromellitic acid dianhydride was used in place of 3,3',4,4'-benzophenonetetracarboxylic acid dianhydride, and the resin was evaluated as in Example 1 to obtain the following results.

The step number of the step tablet was 6, resolution was 4 μm, no squares were peeled off in the Cellotape peeling test, and tensile modulus was 210 kg/mm$^2$. Thus, excellent effects of high sensitivity, high resolution, high adhesion, and low modulus which are useful when applied to a semiconductor device, were simultaneously obtained.

EXAMPLE 4

To 100 parts by weight of the polyamic acid solution (solid content of polyamic acid) obtained in Example 1, there were added 80 parts by weight of N-methylolacrylamide and 5 parts by weight of Michler's ketone, followed by stirring for 3 hours at room temperature to dissolve them and to allow their reaction to proceed.

The resulting solution was coated on an aluminum sheet by a spinner and dried at 70° C. for 1 hour in an oven to obtain a film.

Results of the evaluation were as follows.

The number of steps in the step tablet was 9, resolution was 3 μm, no squares were peeled off in the Cellotape peeling test, and tensile modulus was 230 kg/mm$^2$. Thus, excellent effects of high sensitivity, high resolution, high adhesion and low modulus which are useful when applied to a semiconductor device, were simultaneously obtained.

EXAMPLE 5

A photosensitive resin composition was obtained in the same manner as in Example 4 except that N-methoxymethylacrylamide was used in place of N-methylolacrylamide, and the evaluation was conducted as in Example 4 to obtain the following results.

The step number of the step tablet was 9, resolution was 3 μm, no squares were peeled off in the Cellotape peeling test, and tensile modulus was 235 kg/mm$^2$. Thus, excellent properties of high sensitivity, high resolution, high adhesion, and low modulus which are useful when applied to a semiconductor device, were simultaneously obtained.

EXAMPLE 6

Example 4 was repeated except that 50 parts by weight of dimethacrylamide having the following formula was used in place of N-methylolacrylamide and the evaluation was conducted as in Example 4.

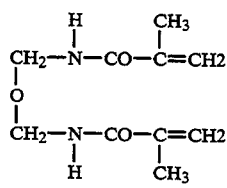

The number of steps of the step tablet was 8, resolution was 3 μm, no squares were peeled off in the Cellotape peeling test, and tensile modulus was 240 kg/mm². Thus, excellent effects of high sensitivity, high resolution, high adhesion and low modulus which are useful when applied to a semiconductor device, were simultaneously obtained.

EXAMPLE 7

To 100 parts by weight of the polyamic acid solution (solid content of polyamic acid) obtained in Example 1, there were added 120 parts by weight of an ether type condensate of N-methylolacrylamide and ethylene glycol and 5 parts by weight of Michler's ketone, followed by stirring for 3 hours at room temperature to dissolve and react them. Results of the evaluation were as follows.

The number of steps of the step tablet was 8, resolution was 4 μm, no squares were peeled off in the Cellotape peeling test, and tensile modulus was 225 kg/mm². Thus, excellent effects of high sensitivity, high resolution, high adhesion and low modulus which are useful when applied to a semiconductor device, were simultaneously obtained.

EXAMPLE 8

A photosensitive resin composition was obtained in the same manner as in Example 7 except that an ether type condensate of N-methylolacrylamide and polyvinyl alcohol was used in place of the ether type condensate of N-methylolacrylamide and ethylene glycol. The evaluation was conducted in the same manner as in Example 1 to obtain the following results. The number of steps of the step tablet was 7, resolution was 3 μm, no squares were peeled off in the Cellotape peeling test, and tensile modulus was 245 kg/mm². Thus, excellent effects of high sensitivity, high resolution, high adhesion and low modulus which are useful when applied to a semiconductor device, were simultaneously obtained.

EXAMPLE 9

A polyamic acid solution was prepared in the same manner as in Example 1 except that N,N-dimethylacrylamide was used in place of N-methylpyrrolidone.

To 612 parts by weight of the resulting polyamic acid solution (100 parts by weight in terms of solid content) was added 5 parts by weight of Michler's ketone (λmax: 365 nm) to dissolve it at room temperature. The resulting composition was coated on a silicon wafer by a spinner and dried at 60° C. for 1 hour by an oven to obtain a film.

This film was evaluated in the same manner as in Example 1 to obtain the following results. The number of steps of the step tablet was 9, resolution was 3 μm, no squares were peeled off in the Cellotape peeling test, and tensile modulus was 210 kg/mm². Thus, excellent effects of high sensitivity, high resolution, high adhesion and low modulus which are useful when applied to a semiconductor device, were simultaneously obtained.

EXAMPLE 10

Example 9 was repeated except that N-acryloylmorpholine was used in place of N,N-dimethylacrylamide, and the evaluation was conducted as in Example 9 to obtain the following results. The number of steps of the step tablet was 7, resolution was 4 μm, no squares were peeled off in the Cellotape peeling test, and tensile modulus was 205 kg/mm². Thus, excellent effects of high sensitivity, high resolution, high adhesion and low modulus which are useful when applied to a semiconductor device, were simultaneously obtained.

EXAMPLE 11

The polyamic acid obtained in Example 1 was added dropwise to 100 liters of methyl alcohol under vigorous stirring to produce precipitate and the precipitate was filtrated. To a polyamic acid solution of 100 g of the resulting solid reaction product dissolved in 525 g of N,N-dimethylacrylamide was added 5 g of Michler's ketone (λmax: 365 nm) and the Michler's ketone was dissolved at room temperature. The similar evaluation was conducted to obtain the following results. The number of steps of the step tablet was 9, resolution was 3 μm, no squares were peeled off in the Cellotape peeling test, and tensile modulus was 200 kg/mm². Thus, excellent effects of high sensitivity, high resolution, high adhesion and low modulus which are useful when applied to a semiconductor device, were simultaneously obtained.

EXAMPLE 12

54 g (0.1 mol) of a compound having five siloxane bonds (n=5) represented by the following formula as a silicone diamine, 322 g (1.0 mol) of 3,3',4,4'-benzophenonetetracarboxylic acid dianhydride and 11.4 g (0.05 mol) of glycerol dimethacrylate were introduced into 2890 g of N-methyl-2-pyrrolidone, and their reaction was allowed to proceed at 50° C. for 16 hours.

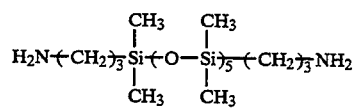

Then, 180 g (0.9 mol) of 4,4'-diaminodiphenyl ether was introduced thereinto and their reaction was allowed to proceed at 20° C. for 6 hours.

To 612 parts by weight (100 parts by weight in terms of solid content) of the resulting polyamic acid solution, there were added 50 parts by weight of methacrylamide and 5 parts by weight of Michler's ketone (λmax: 365 nm) and they were dissolved at room temperature.

Then, the evaluation was conducted as in Example 1 to obtain the following results. The number of steps of the step tablet was 7, resolution was 3 μm, no squares were peeled off in the Cellotape peeling test, and tensile modulus was 240 kg/mm². Thus, excellent effects of high sensitivity, high resolution, high adhesion and low modulus which are useful when applied to a semiconductor device, were simultaneously obtained.

EXAMPLE 13

25 g (0.1 mol) of a compound having one siloxane bond (n=1) represented by the following formula, 322 g (1.0 mol) of 3,3',4,4'-benzophenonetetracarboxylic acid dianhydride and 11.4 g (0.05 mol) of glycerol dimethacrylate were introduced into 2890 g of N,N-dimethylacrylamide, and their reaction was allowed to proceed at 50° C. for 16 hours.

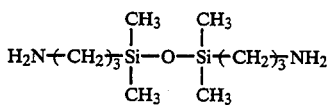

Then, 180 g (0.9 mol) of 4,4'-diaminodiphenyl ether was introduced thereinto, and their reaction was allowed to proceed at 20° C. for 6 hours.

To 612 g (100 g in terms of solid content) of the resulting polyamic acid solution was added 5 g of Michler's ketone (λmax: 365 nm), and this was dissolved at room temperature. The resulting composition was coated on a silicon wafer by a spinner and dried at 50° C. for 1 hour by an oven to obtain a film. The film was evaluated in the same manner as in Example 9 to obtain the following results. The number of steps of the step tablet was 12, resolution was 3 μm, and no squares were peeled off in the Cellotape peeling test. Thus, excellent effects of high sensitivity, high resolution, and high adhesion which are useful when applied to a semiconductor device, were simultaneously obtained.

EXAMPLE 14

A photosensitive resin composition was obtained in the same manner as in Example 13 except that 2-hydroxyethyl methacrylate was used in place of glycerol dimethacrylate. The composition was evaluated in the same manner as in Example 13 to obtain the following results. The number of steps of the step tablet was 11, resolution was 3 μm, and no squares were peeled off in the Cellotape peeling test. Thus, excellent effects of high sensitivity, high resolution, and high adhesion which are useful when applied to a semiconductor device, were simultaneously obtained.

EXAMPLE 15

A photosensitive resin composition was obtained in the same manner as in Example 13 except that 4 g (4 parts by weight) of 2-(p-dimethylaminostyryl)benzoxazole and 8 g (8 parts by weight) of N-phenylglycine were used in place of Michler's ketone, and the evaluation was conducted as in Example 13 to obtain the following results. The number of steps of the step tablet was 10, resolution was 3 μm, no squares were peeled off in the Cellotape peeling test, and tensile modulus was 205 kg/mm². Thus, excellent effects of high sensitivity, high resolution, high adhesion and low modulus which are useful when applied to a semiconductor device, were simultaneously obtained.

EXAMPLE 16

A photosensitive resin composition was obtained in the same manner as in Example 13 except that 4 g of 2-(p-dimethylaminostyryl)benzoxazole and 8 g of phenyloxazolone were used in place of Michler's ketone, and the evaluation was conducted as in Example 13 to obtain the following results. The number of steps of the step tablet was 9, resolution was 3 μm, no squares were peeled off in the Cellotape peeling test, and tensile modulus was 210 kg/mm². Thus, excellent effects of high sensitivity, high resolution, high adhesion and low modulus which are useful when applied to a semiconductor device, were simultaneously obtained.

EXAMPLE 17

A photosensitive resin composition was obtained in the same manner as in Example 13 except that 4 g of 3,3'-carbonyl-bis(7-diethylaminocoumarin) and 8 g of N-phenylglycine were used in place of Michler's ketone, and the evaluation was conducted as in the same manner as in Example 13 to obtain the following results. The number of steps of the step tablet was 10, resolution was 4 μm, no squares were peeled off in the Cellotape peeling test, and tensile modulus was 215 kg/mm². Thus, excellent effects of high sensitivity, high resolution, high adhesion and low modulus which are useful when applied to a semiconductor device, were simultaneously obtained.

EXAMPLE 18

A photosensitive resin composition was obtained in the same manner as in Example 13 except that 4 g of 3,3'-carbonyl-bis(7-diethylaminocoumarin) and 8 g of phenyloxazolone were used in place of Michler's ketone, and the evaluation was conducted as in the same manner as in Example 13 to obtain the following results. The number of steps of the step tablet was 8, resolution was 4 μm, no squares were peeled off in the Cellotape peeling test, and tensile modulus was 230 kg/mm². Thus, excellent effects of high sensitivity, high resolution, high adhesion and low modulus which are useful when applied to a semiconductor device, were simultaneously obtained.

EXAMPLE 19

A photosensitive resin composition was obtained in the same manner as in Example 13 except that 4 g (4 parts by weight) of 2-(p-dimethylaminostyryl)benzoxazole and 8 g (8 parts by weight) of N-phenylglycine were used in place of Michler's ketone and 12 g (12 parts by weight) of N,N-dimethylaminoethylmethacrylate was further added. Evaluation thereof was conducted in the same manner as in Example 13 to obtain the following results. The number of steps of the step tablet was 13, resolution was 3 μm, no squares were peeled off in the Cellotape peeling test, and tensile modulus was 235 kg/mm². Thus, excellent effects of high sensitivity, high resolution, high adhesion and low modulus which are useful when applied to a semiconductor device, were simultaneously obtained.

EXAMPLE 20

The photosensitive resin composition obtained in Example 1 was spin-coated by a spinner on a silicon wafer on which a semiconductor device circuit of ultra LSI (1M bit) had been formed, and dried at 80° C. for 1 hour in an oven to form a polyimide film on the whole surface of the wafer.

Then, the film was exposed and developed and the film on bonding pad portion was removed. Then, the wafer was heat-treated at 150° C., 250° C. and 350° C. for 30 minutes, respectively and the heat-treated wafer was scribed and cut into chips of 6×12 mm square. This semiconductor device was mounted on a metal frame and bonded by gold wire and thereafter, sealed with an epoxy molding compound. The resulting semiconductor apparatus showed no failures for more than 2000 hours in a high temperature, high humidity, and high bias test (85° C., 85%RH, application of 10V) and in a pressure cooker test (125° C., 2.3 atm), and besides there occurred no error operation by α ray.

Similarly, good semiconductor apparatuses were obtained in the same manner as above using the compositions obtained in Examples 2, 3, 4, 9, 12 and 13.

EXAMPLE 21

A semiconductor apparatus having a two-layer wiring structure was made using the photosensitive resin composition obtained in Example 1.

The above photosensitive resin composition was coated on a silicon wafer on which a semiconductor device circuit had been formed, and then the coated film was subjected to exposure, development and curing to form a polyimide insulator of 1.5 μm thickness having through-holes. Then, aluminum wiring as a second layer was formed by sputtering and was connected with the under circuit. Furthermore, a polyimide insulator was formed using the above photosensitive resin composition in the same manner as in formation of the first layer. Moreover, a silicon nitride film was formed by a plasma CVD apparatus, and thereon was further formed a film using the above photosensitive resin at a thickness of 4 μm. The silicon nitride film was subjected to etching using the polyimide film as a resist to make an electrode. This silicon wafer was scribed and cut into chips of 5×6 mm square. This semiconductor device was mounted on a metal frame and bonded by gold wire and thereafter, was sealed with an epoxy molding compound. The resulting semiconductor apparatus showed no failures for more than 2000 hours in a high temperature, high humidity, and high bias test (85° C. 85%RH application of 10 V) and in a pressure cooker test (125° C., 2.3 atm). Moreover, there was caused no error operation due to α-ray.

Furthermore, good semiconductor apparatuses were obtained by the same operation as above using the compositions obtained in Examples 2, 3, 4, 9, 12, and 13.

EXAMPLE 22

A copper wiring was formed by electroless plating or electrolytic plating on an alumina ceramic substrate of 50 mm square on which a polyimide film had been formed, and the photosensitive resin composition obtained in Example 13 was coated thereon and exposed, developed and cured to form a polyimide insulating layer. Furthermore, a copper wiring was formed as a second layer by electroless plating or electrolytic plating. This procedure was repeated to make a four-layer wiring substrate. This substrate showed little change in connection resistance even after subjected to a thermal shock cycle test of 2000 times at −65° C. to 125° C. and it was found that the substrate was excellent. Two LSIs were connected using this substrate. This high density assembly substrate was improved by 30% in wiring delay time as compared with conventional ceramic wiring substrates.

COMPARATIVE EXAMPLE 1

A resin composition was obtained in the same manner as in Example 1 except that methyl methacrylate was used in place of methacrylamide, and the composition was subjected to the same evaluation as in Example 1. The photosensitive agent had no amide group and so was inferior in compatibility with the polyamic acid, and no pattern could be formed.

COMPARATIVE EXAMPLE 2

A photosensitive resin composition was obtained in the same manner as in Example 1 except that diethylene glycol dimethyacrylate was used in place of methacrylamide, and the same evaluation was carried out.

The photosensitive agent had no amide group and so was inferior in compatibility with the polyamic acid, and no pattern could be formed.

COMPARATIVE EXAMPLE 3

Blending of components was carried out in the same manner as in Example 9 except that N-methyl-2-pyrrolidone was used in place of N,N-dimethylacrylamide. The composition showed no responsiveness to light. Therefore, 60 parts by weight of dimethylaminoethyl methacrylate was further added as a compound having carbon-carbon double bond and amino group capable of being dimerized or polymerized by actinic ray. Coating of the composition and evaluation of the coated film were carried out in the same manner as in Example 9. The number of steps of the step tablet was only 5, which means low sensitivity. Furthermore, when change of the viscosity of the composition at room temperature (23° C.) was measured the viscosity decreased by 20% after 3 days.

COMPARATIVE EXAMPLE 4

A photosensitive resin composition was obtained in the same manner as in Example 1 except that Michler's ketone was not used, and the evaluation was carried out as in Example 1. Photo-reaction did not efficiently proceed and patterns wholly flowed away at development, and thus this could not be practically used.

COMPARATIVE EXAMPLE 5

290 g of 3,3′,4,4′-benzophenonetetracarboxylic acid dianhydride and 244 g of 2-hydroxyethyl methacrylate were dissolved in γ-butyrolactone, and then 150 g of pyridine was added thereto as a catalyst and their reaction was allowed to proceed at 20° C. for 24 hours to obtain an esterification product. Then, thereto were added dicyclohexylcarbodiimide as an amidation catalyst and thereafter further added 180 g of 4,4′-diaminodiphenyl ether and 55 g of a compound having five siloxane bonds (n=5) represented by the following formula as a silicone diamine, and their reaction was allowed to proceed at 20° C. for 8 hours.

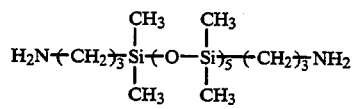

Then, the resulting slurry was filtrated and the filtrate was added dropwise to 350 liters of ethanol with vigorous stirring to precipitate a polymer, which was allowed to stand for 12 hours. The precipitate was filtrated, dried and ground. Molecular weight of the resulting polymer was 2000, which was considerably smaller than that expected. Therefore, another polymer was again produced in the same manner, but also in this case, the molecular weight was merely 3300. Not only this method required long time in complicated steps, but also the product showed much variation in quality.

Next, this polymer was dissolved in N-methyl2-pyrrolidone, and the same sensitizer as used in Example 1 was added to the solution to obtain a photosensitive resin composition. This composition was evaluated in the same manner as in Example 1 to obtain the following results. The number of steps of the step tablet was 3,

What is claimed is:

1. A photosensitive resin composition which comprises as essential components:

(A) a polyamic acid having a recurring unit represented by the following formula [I]:

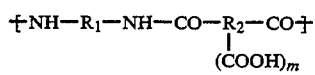

wherein 0.5–50 mol % of $R_1$ consists of a silicone diamine residue represented by the following formula [II]:

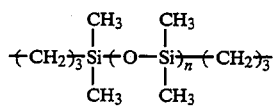

wherein n represents an integer of 1–50, and the remainder of 50–99.5 mol % of $R_1$ consists of an organic group selected from the group consisting of an aromatic group, an aliphatic group, an alicyclic group, and a heterocyclic group, and $R_2$ consists of an organic group selected from the group consisting of an aromatic group, an aliphatic group, an alicyclic group, a heterocyclic group, and a silicone group, and m represents 1 or 2, (B) an amide compound having a carbon-carbon double bond, (C) a photosensitizer, and (D) a dialkylaminoacrylate or methacrylate compound represented by the formula [XV]:

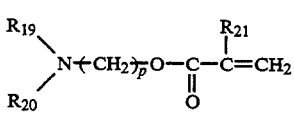

wherein $R_{19}$ and $R_{20}$ each represents $CH_3$ or $C_2H_5$, $R_{21}$ represents H or $CH_3$, and p is 2 or 3.

2. A photosensitive resin composition which comprises as essential components:

(A) an acid anhydride terminated polyamic acid, both ends of which are substituted with an actinic ray responsive group P* and which is represented by the following formula [III]:

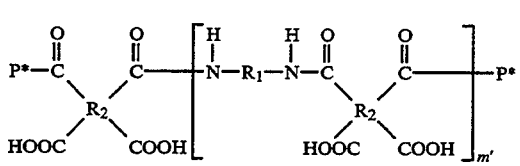

wherein m' represents an integer of 10–10000, and P* is a 2-hydroxyethyl methacrylate or acrylate residue represented by the following formula [IV]:

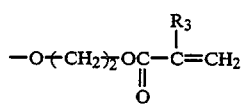

wherein $R_3$ represents H or $CH_3$, or P* is a glycerol dimethacrylate or diacrylate residue represented by the following formula IV]:

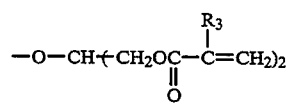

wherein $R_3$ represents H or $CH_3$, and wherein 0.5–50 mol % of $R_1$ consists of a silicone diamine residue represented by the following formula [II]:

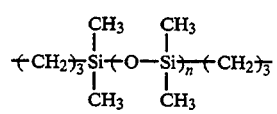

wherein n represents an integer of 1–50, and the remainder of 50–99.5 mol % of $R_1$ consists of an organic group selected from the group consisting of an aromatic group, an aliphatic group, an alicyclic group, and a heterocyclic group, and $R_2$ consists of an organic group selected from the group consisting of an aromatic group, an aliphatic group, an alicyclic group, a heterocyclic group, and a silicone group, (B) an amide compound having a carbon-carbon double bond, and (C) a photosensitizer.

3. A photosensitive resin composition according to claim 2, wherein the silicone diamine residue which is a comonomer for the polyamic acid (A), is represented by the following formula [VI] which corresponds to the formula [II] where n is 1:

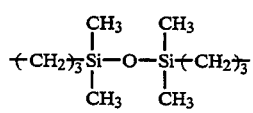

4. A photosensitive resin composition according to claim 3, wherein the polyamic acid (A) is prepared from a silicone diamine and 4,4'-diaminodiphenyl ether and pyromellitic acid dianhydride or 3,3',4,4'-benzophenonetetracarboxylic acid dianhydride as main components.

5. A photosensitive resin composition according to claim 4, wherein the amide compound (B) having carbon-carbon double bond is a diacrylamide or dimethacrylamide compound represented by the following formula [X]:

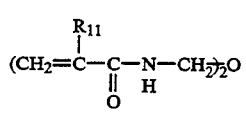

wherein $R_{11}$ represents H or $CH_3$.

6. A photosensitive resin composition according to claim 3, wherein the amide compound (B) having carbon-carbon double bond ms an acrylamide or a methacrylamide.

7. A photosensitive resin composition according to claim 3, wherein the amide compound (B) having carbon-carbon double bond is a dialkylacrylamide compound or a dialkylmethacrylamide compound represented by the following formula [VIII]:

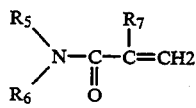

wherein $R_5$ and $R_6$ each represents $CH_3$ or $C_2H_5$, and $R_7$ represents H or $CH_3$.

8. A photosensitive resin composition according to claim 3, wherein the amide compound (B) having carbon-carbon double bond is a diacrylamide or dimethacrylamide compound represented by the following formula [X]:

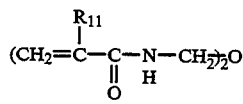

wherein $R_{11}$ represents H or $CH_3$.

9. A photosensitive resin composition according to any of claims 2, wherein the silicone diamine residue which is a comonomer for the polyamic acid (A), is represented by the following formula [VII]

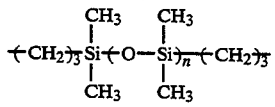

wherein n is 5-20.

10. A photosensitive resin composition according to claim 9, wherein the polyamic acid (A) is prepared from a silicone diamine and 4,4'-diaminodiphenyl ether and pyromellitic acid dianhydride or 3,3',4,4'-benzophenonetetracarboxylic acid dianhydride as main components.

11. A photosensitive resin composition according to claim 10, wherein the amide compound (B) having carbon-carbon double bond is a diacrylamide or dimethacrylamide compound represented by the following formula [X]:

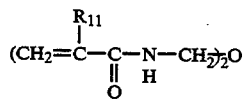

wherein $R_{11}$ represents H or $CH_3$.

12. A photosensitive resin composition according to claim 9, wherein the amide compound (B) having carbon-carbon double bond ms an acrylamide or a methacrylamide.

13. A photosensitive resin composition according to claim 9, wherein the amide compound (B) having carbon-carbon double bond is a dialkylacrylamide compound or a dialkylmethacrylamide compound represented by the following formula [VIII]:

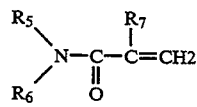

wherein $R_5$ and $R_6$ each represents $CH_3$ or $C_2H_5$, and $R_7$ represents H or $CH_3$.

14. A photosensitive resin composition according to claim 9, wherein the amide compound (B) having carbon-carbon double bond is a diacrylamide or dimethacrylamide compound represented by the following formula [X]:

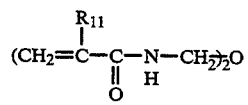

wherein $R_{11}$ represents H or $CH_3$.

15. A photosensitive resin composition according to any of claim 2 wherein the polyamic acid (A) is prepared from a silicone diamine and 4,4'-diaminodiphenyl ether and pyromellitic acid dianhydride or 3,3',4,4'-benzophenonetetracarboxylic acid dianhydride as main components.

16. A photosensitive resin composition according to claim 15, wherein the amide compound (B) having carbon-carbon double bond ms an acrylamide or a methacrylamide.

17. A photosensitive resin composition according to claim 15, wherein the amide compound (B) having carbon-carbon double bond is a dialkylacrylamide compound or a dialkylmethacrylamide compound represented by the following formula [VIII]:

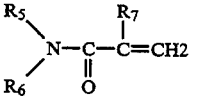

wherein $R_5$ and $R_6$ each represents $CH_3$ or $C_2H_5$, and $R_7$ represents H or $CH_3$.

18. A photosensitive resin composition according to claim 15, wherein the amide compound (B) having carbon-carbon double bond is a diacrylamide or dimethacrylamide compound represented by the following formula [X]:

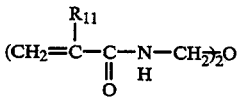

wherein $R_{11}$ represents H or $CH_3$.

19. A photosensitive resin composition according to any of claim 2 wherein the amide compound (B) having carbon-carbon double bond is liquid at room temperature.

20. A photosensitive resin composition according to claim 19, wherein the polyamic acid (A) is obtained by reaction in the amide compound having carbon-carbon double bond which is liquid at room temperature.

21. A photosensitive resin composition according to claim 2, wherein the amide compound (B) having carbon-carbon double bond is an acrylamide or a methacrylamide.

22. A photosensitive resin composition according to any of claim 2, wherein the amide compound (B) having carbon-carbon double bond is a dialkylacrylamide compound or a dialkylmethacrylamide compound represented by the following formula [VIII]:

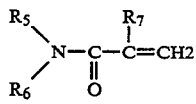

wherein $R_5$ and $R_6$ each represents $CH_3$ or $C_2H_5$, and $R_7$ represents H or $CH_3$.

23. A photosensitive resin composition according to claims 2, wherein the amide compound (B) having carbon-carbon double bond is a diacrylamide or dimethacrylamide compound represented by the following formula [X]:

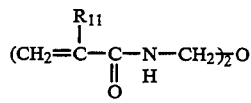

wherein $R_{11}$ represents H or $CH_3$.

24. A photosensitive resin composition according to claims 2, wherein the photosensitizer (C) has an absorption maximum wavelength, λmax of 330–500 nm.

25. A photosensitive resin composition which comprises as essential components:

(A) a polyamic acid having a recurring unit represented by the following formula [I]:

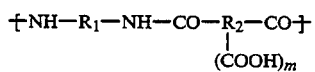

wherein 0.5–50 mol % of $R_m$ consists of a silicone diamine residue represented by the following formula [II]:

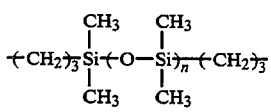

wherein n represents an integer of 1–50, and the remainder of 50–99.5 mol % of $R_m$ consists of an organic group selected from the group consisting of an aromatic group, an aliphatic group, an alicyclic group and a heterocyclic group, and $R_2$ consists of an organic group selected from the group consisting of an aromatic group, an aliphatic group, an alicyclic group, a heterocyclic group, and a silicone group, and m is 2, said polyamic acid (A) being acid anhydride terminated, both ends of which are substituted with actinic ray responsive group P* and which is represented by the following formula [III]:

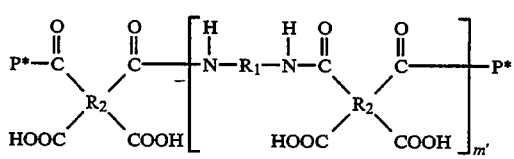

wherein $R_1$ and $R_2$ are the same as defined above, and m' represents an integer of 10–10000, and P* is represented by the following formula:

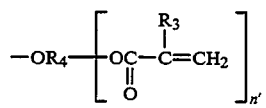

wherein $R_3$ represents H or $CH_3$, $R_4$ represents an organic residue, and n' represents an integer of 1–5, (B) 10–500 parts by weight per 100 parts by weight of the polyamic acid (A) of an amide compound having a carbon-carbon double bond, and (C) a photosensitizer.

26. A photosensitive resin composition according to claim 25, wherein the silicone diamine residue which is a comonomer for the polyamic acid (A), is represented by the following formula [VI] which corresponds to the formula [II] where n is 1:

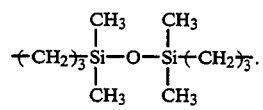

27. A photosensitive resin composition according to claim 26, wherein the polyamic acid (A) is prepared from a silicone diamine and 4,4'-diaminodiphenyl ether and pyromellitic acid dianhydride or 3,3',4,4'-benzophenonetetracarboxylic acid dianhydride as main components.

28. A photosensitive resin composition according to claim 27, wherein the amide compound (B) having carbon-carbon double bond is a diacrylamide or dimethacrylamide compound represented by the following formula [X]:

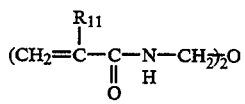

wherein $R_{11}$ represents H or $CH_3$.

29. A photosensitive resin composition according to claim 26, wherein the amide compound (B) having carbon-carbon double bond ms an acrylamide or a methacrylamide.

30. A photosensitive resin composition according to claim 26, wherein the amide compound (B) having carbon-carbon double bond is a dialkylacrylamide compound or a dialkylmethacrylamide compound represented by the following formula [VIII]:

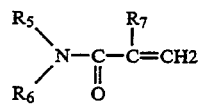

wherein $R_3$ and $R_6$ each represents $CH_3$ or $C_2H_3$, and $R_7$ represents H or $CH_3$.

31. A photosensitive resin composition according to claim 26, wherein the amide compound (B) having carbon-carbon double bond is a diacrylamide or dimethacrylamide compound represented by the following formula [X]:

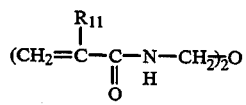

wherein $R_{11}$ represents H or $CH_3$.

32. A photosensitive resin composition according to claim 25, wherein the silicone diamine residue which is a comonomer for the polyamic acid (A), is represented by the following formula [VII]:

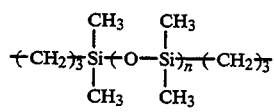

33. A photosensitive resin composition according to claim 32, wherein the polyamic acid (A) is prepared from a silicone diamine and 4,4'-diaminodiphenyl ether and pyromellitic acid dianhydride or 3,3',4,4'-benzophenonetetracarboxylic acid dianhydride as main components.

34. A photosensitive resin composition according to claim 33, wherein the amide compound (B) having carbon-carbon double bond is a diacrylamide or dimethacrylamide compound represented by the following formula [X]:

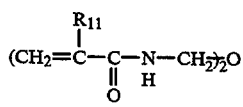

wherein $R_{11}$ represents H or $CH_3$.

35. A photosensitive resin composition according to claim 32, wherein the amide compound (B) having carbon-carbon double bond ms an acrylamide or a methacrylamide.

36. A photosensitive resin composition according to claim 32, wherein the amide compound (B) having carbon-carbon double bond is a dialkylacrylamide compound or a dialkylmethacrylamide compound represented by the following formula [VIII]:

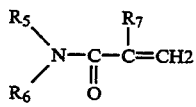

wherein $R_5$ and $R_6$ each represents $CH_3$ or $C_2H_5$, and $R_7$ represents H or $CH_3$.

37. A photosensitive resin composition according to claim 32, wherein the amide compound (B) having carbon-carbon double bond is a diacrylamide or dimethacrylamide compound represented by the following formula [X]:

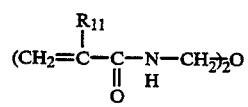

wherein $R_{11}$ represents H or $CH_3$.

38. A photosensitive resin composition according to claim 25, wherein the polyamic acid (A) is prepared from a silicone diamine and 4,4'-diaminodiphenyl ether and pyromellitic acid dianhydride or 3,3',4,4'-benzophenonetetracarboxylic acid dianhydride as main components.

39. A photosensitive resin composition according to claim 38, wherein the amide compound (B) having carbon-carbon double bond ms an acrylamide or a methacrylamide.

40. A photosensitive resin composition according to claim 38, wherein the amide compound (B) having carbon-carbon double bond is a dialkylacrylamide compound or a dialkylmethacrylamide compound represented by the following formula [VIII]:

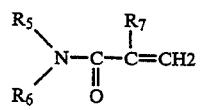

wherein $R_5$ and $R_6$ each represents $CH_3$ or $C_2H_5$, and $R_2$ represents H or $CH_3$.

41. A photosensitive resin composition according to claim 38, wherein the amide compound (B) having carbon-carbon double bond is a diacrylamide or dimethacrylamide compound represented by the following formula [X]:

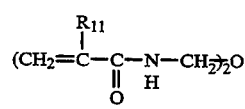

wherein $R_{11}$ represents H or $CH_3$.

42. A photosensitive resin composition according to claim 25, wherein the amide compound (B) having carbon-carbon double bond ms an acrylamide or a methacrylamide.

43. A photosensitive resin composition according to claim 25, wherein the amide compound (B) having carbon-carbon double bond is a dialkylacrylamide compound or a dialkylmethacrylamide compound represented by the following formula [VIII]:

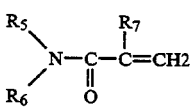

wherein $R_5$ and $R_6$ each represents $CH_3$ or $C_2H_5$, and $R_7$ represents H or $CH_3$.

44. A photosensitive resin composition in accordance with claim 25, wherein said mid-compound having a carbon-carbon double bond is an N-methylol-acrylamide or methacrylamide derivative or an N-alkoxymethylacrylamide or methacrylamide derivative represented by the following formula [IX]:

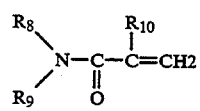

wherein $R_8$ represents H, $CH_3$, $C_2H_5$, $CH_2OH$, or $CH_2OCH_3$, $R_9$ represents $-CH_2OH$, $-CH_2OCH_3$, $-CH_2OC_2H_5$, $-CH_2OC_3H_7$ or $CH_2OC_4H_9$, and $R_{10}$ represents H or $CH_3$.

45. A photosensitive resin composition according to claim 25, wherein the amide compound (B) having carbon-carbon double bond is a diacrylamide or dimethacrylamide compound represented by the following formula [X]:

$$(CH_2=C(R_{11})-C(=O)-N(H)-CH_2)_2O \quad [X]$$

wherein $R_{11}$ represents H or $CH_3$.

46. A photosensitive resin composition according to claim 25, wherein the photosensitizer (C) has an absorption maximum wavelength, cmax of 330–500 nm.

47. A photosensitive resin composition according to claim 25, wherein the amide compound (B) having carbon-carbon double bond is liquid at room temperature.

48. A photosensitive resin composition which comprises as essential components:
  (A) a polyamic acid having a recurring unit represented by the following formula [I]:

$$+NH-R_1-NH-CO-R_2(COOH)_m-CO+ \quad [I]$$

wherein 0.5–50 mol % of $R_1$ consists of a silicone diamine residue represented by the following formula [II]:

$$+CH_2)_3Si(CH_3)_2-O-(Si(CH_3)_2-O)_n-(CH_2)_3+ \quad [II]$$

wherein n represents an integer of 1–50, and the remainder of 50–99.5 mol % of $R_1$ consists of an organic group selected from the group consisting of an aromatic group, an aliphatic group, an alicyclic group and a heterocyclic group, and $R_2$ consists of an organic group selected from the group consisting of an aromatic group, an aliphatic group, an alicyclic group, a heterocyclic group, and a silicone group, and m represents 1 or 2,
  (B) 10–500 parts by weight per 100 parts by weight of the polyamic acid (A) of N-acryloyl-morpholine, and
  (C) a photosensitizer.

49. A photosensitive resin composition which comprises as essential components:
  (A) a polyamic acid having a recurring unit represented by the following formula [I]:

$$+NH-R_1-NH-CO-R_2(COOH)_m-CO+ \quad [I]$$

wherein 0.5–50 mol % of $R_1$ consists of a silicone diamine residue represented by the following formula [II]:

$$+CH_2)_3Si(CH_3)_2-O-(Si(CH_3)_2-O)_n-(CH_2)_3+ \quad [II]$$

wherein n represents an integer of 1–50, and the remainder of 50–99.5 mol % of $R_1$ consists of an organic group selected from the group consisting of an aromatic group, an aliphatic group, an alicyclic group and a heterocyclic group, and $R_2$ consists of an organic group selected from the group consisting of an aromatic group, an aliphatic group, an alicyclic group, a heterocyclic group, and a silicone group, and m represents 1 or 2,
  (B) 10–500 parts by weight per 100 parts by weight of the polyamic acid (A) of an ether type condensate of N-methylolacrylamide or methacrylamide and a polyhydric alcohol, and
  (C) a photosensitizer.

50. A photosensitive resin composition which comprises as essential components:
  (A) a polyamic acid having a recurring unit represented by the following formula [I]:

$$+NH-R_1-NH-CO-R_2(COOH)_m-CO+ \quad [I]$$

wherein 0.5–50 mol % of $R_1$ consists of a silicone diamine residue represented by the following formula [II]:

$$+CH_2)_3Si(CH_3)_2-O-(Si(CH_3)_2-O)_n-(CH_2)_3+ \quad [II]$$

wherein n represents an integer of 1–50, and the remainder of 50–99.5 mol % of $R_1$ consists of an organic group selected from the group consisting of an aromatic group, an aliphatic group, an alicyclic group and a heterocyclic group, and $R_2$ consists of an organic group selected from the group consisting of an aromatic group, an aliphatic group, an alicyclic group, a heterocyclic group, and a silicone group, and m represents 1 or 2,
  (B) 10–500 parts by weight per 100 parts by weight of the polyamic acid (A) of an amide compound having carbon-carbon double bond, and
  (C) a styryl compound photosensitizer of the formula [XI]:

$$R_{12}\text{-}N(R_{12})\text{-}C_6H_4\text{-}CH=CH\text{-}R_{13} \quad [XI]$$

wherein $R_{12}$ represents —H, —$CH_3$, —$C_2H_5$, or —$C_6H_5$, $R_{13}$: represents benzoxazol-2-yl, benzothiazol-2-yl, 2-(2-nitrophenyl)vinyl, benzimidazol-2-yl, 2-(2-nitrophenyl)vinyl groups -continued

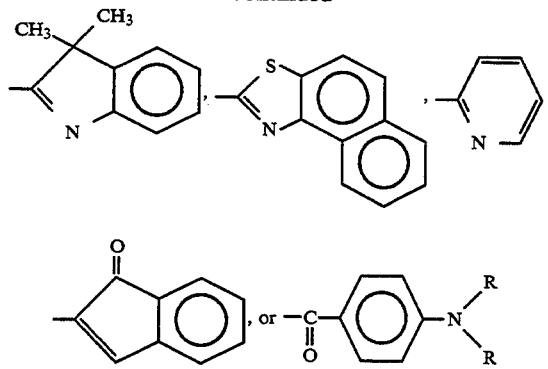

where R means H, CH₃ or C₂H₅.

51. A photosensitive resin composition which comprises as essential components:

(A) a polyamic acid having a recurring unit represented by the following formula [I]:

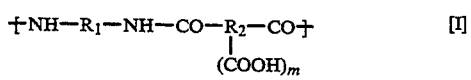

wherein 0.5-50 mol % of $R_1$ consists of a silicone diamine residue represented by the following formula [II]:

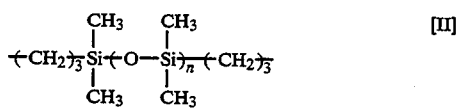

wherein n represents an integer of 1–50, and the remainder of 50–99.5 mol % of $R_1$ consists of an organic group selected from the group consisting of an aromatic group, an aliphatic group, an alicyclic group and a heterocyclic group, and $R_2$ consists of an organic group selected from the group consisting of an aromatic group, an aliphatic group, an alicyclic group, a heterocyclic group, and a silicone group, and m represents 1 or 2, (B) 10–500 parts by weight per 100 parts by weight of the polyamic acid (A) of an amide compound having carbon-carbon double bond, and (C) a glycine compound photosensitizer represented by the following formula [XII]:

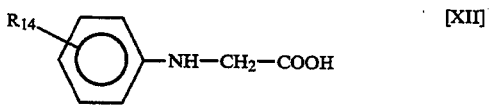

wherein $R_{14}$ represents —H, —CH₃, —C₂H₅, —C₆H₅, —OCH₃, —OCOCH₃, —OC₂H₅, —OCOC₂H₅, —N(CH₃)₂, —N(C₂H₅)₂, —NHCOOCH₃, —COCH₃, —COC₂H₅, —NHCONH₂, —CH₂OH, —OH, —CH(CH₃)₂, or —C(CH₃)₃.

52. A photosensitive resin composition which comprises as essential components:

(A) a polyamic acid having a recurring unit represented by the following formula [I]:

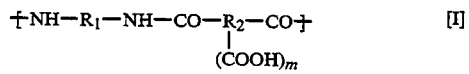

wherein 0.5-50 mol % of $R_1$ consists of a silicone diamine residue represented by the following formula [II]:

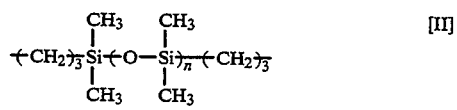

wherein n represents an integer of 1–50, and the remainder of 50–99.5 mol % of $R_1$ consists of an organic group selected from the group consisting of an aromatic group, an aliphatic group, an alicyclic group and a heterocyclic group, and $R_2$ consists of an organic group selected from the group consisting of an aromatic group, an aliphatic group, an alicyclic group, a heterocyclic group, and a silicone group, and m represents 1 or 2, (B) 10–500 parts by weight per 100 parts by weight of the polyamic acid (A) of an amide compound having carbon-carbon double bond, and (C) a photosensitizer which is a biscoumarin compound substituted with carbonyl group at 3-position represented by the following formula [XIII]:

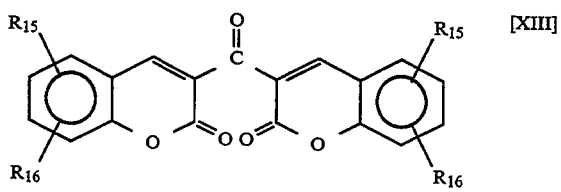

wherein $R_{15}$ and $R_{16}$ each represents hydrogen atom, an alkoxy group or a dialkylamino group.

53. A photosensitive resin composition which comprises as essential components:

(A) a polyamic acid having a recurring unit represented by the following formula [I]:

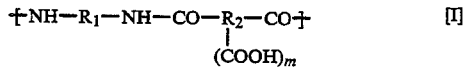

wherein 0.5-50 mol % of $R_1$ consists of a silicone diamine residue represented by the following formula [II]:

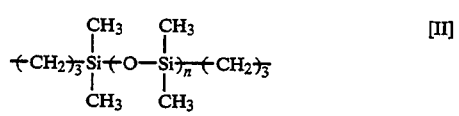

wherein n represents an integer of 1–50, and the remainder of 50–99.5 mol % of $R_1$ consists of an organic group selected from the group consisting of an aromatic group, an aliphatic group, an alicyclic group and a heterocyclic group, and $R_2$ consists of an organic group selected from the group consisting of an aromatic group, an aliphatic group, an alicyclic group, a heterocyclic group, and a silicone group, and m represents 1 or 2, (B) 10–500 parts by weight per 100 parts by weight of the polyamic acid (A) of an amide compound having carbon-carbon double bond, and
(C) an oxazolone compound photosensitizer of the formula
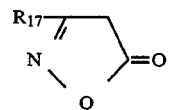
[XIV]
wherein $R_{17}$, represents
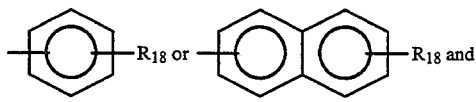
and
$R_{18}$ represents —H, —CH$_3$, —C$_2$H$_5$, —C$_3$H$_7$, —C$_4$H$_9$, —C$_6$H$_5$, —OH, —OCH$_3$, or —OC$_2$H$_5$.
* * * * *